United States Patent
O'Halloran et al.

(10) Patent No.: US 7,436,221 B2
(45) Date of Patent: Oct. 14, 2008

(54) METHODS AND APPARATUS FOR ULTRA-LOW LEAKAGE ANALOG STORAGE

(75) Inventors: Micah Galletta O'Halloran, Hyde Park, MA (US); Rahul Sarpeshkar, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 11/256,632

(22) Filed: Oct. 21, 2005

(65) Prior Publication Data
US 2006/0087362 A1    Apr. 27, 2006

Related U.S. Application Data

(60) Provisional application No. 60/620,911, filed on Oct. 21, 2004.

(51) Int. Cl.
*H03K 5/00* (2006.01)
(52) U.S. Cl. .......................... 327/91; 327/92
(58) Field of Classification Search ............. 327/91–96
See application file for complete search history.

(56) References Cited

U.S. PATENT DOCUMENTS

| | | | | |
|---|---|---|---|---|
| 5,422,583 | A |   | 6/1995 | Blake et al. ................ 327/94 |
| 5,880,620 | A |   | 3/1999 | Gitlin et al. ............... 327/534 |
| 6,069,502 | A |   | 5/2000 | Preslar et al. .............. 327/94 |
| 6,211,914 | B1 | * | 4/2001 | Kubo ........................ 348/241 |
| 6,265,911 | B1 |   | 7/2001 | Nairn ........................ 327/94 |
| 6,407,592 | B2 | * | 6/2002 | Ueno ........................ 327/95 |
| 7,088,147 | B2 | * | 8/2006 | Prasad et al. ............. 327/91 |
| 2002/0039020 | A1 | * | 4/2002 | Bellaouar et al. ...... 324/76.58 |
| 2004/0232948 | A1 | * | 11/2004 | Rossi ........................ 327/94 |
| 2005/0111128 | A1 | * | 5/2005 | Fischer et al. ............. 360/66 |
| 2006/0017828 | A1 | * | 1/2006 | Rossi ........................ 348/255 |
| 2006/0087362 | A1 | * | 4/2006 | O'Halloran et al. ...... 327/427 |
| 2006/0231733 | A1 | * | 10/2006 | Boemler ................... 250/208.1 |

FOREIGN PATENT DOCUMENTS

EP    0 597 200 A1    8/1993

OTHER PUBLICATIONS

PCT/US2005/037850 International Search Report dated Feb. 12, 2006.
E. Vittoz, H. Oguey, M.A. Maher, O. Nys, E. Dijkstra, Analog Storage of Adjustable Synaptic Weights, 1991, p. 47-63, Dortmund, Germany.
Micah O'Halloran and Rahul Sarpeshkar, A 10-nW 12-bit Accurate Analog Storage Cell With 10-aA Leakage, 2004, pp. 1985-1996, Cambridge, Massachusetts.

* cited by examiner

*Primary Examiner*—Tuan T. Lam
*Assistant Examiner*—Hiep Nguyen
(74) *Attorney, Agent, or Firm*—Daly, Crowley, Mofford & Durkee, LLP

(57) ABSTRACT

An analog storage cell circuit includes a switch that minimizes subthreshold conduction and diode leakage, as well as an accumulation-mode coupling mechanism to minimize overall switch leakage to minimize accumulation-mode leakage. In one embodiment, an analog storage circuit includes a sample and hold circuit including an amplifier having first and second inputs and a switch coupled to the first input of the amplifier. The switch includes a first switching device forming a core of the switch, a second switching device coupled to the first switching device to disconnect the first switching device from a first terminal during the hold phase, and a third switching device coupled to the first switching device to connect the first switching device to a second terminal during the hold phase to minimize accumulation mode conduction in the first switching device.

4 Claims, 14 Drawing Sheets

METHODS AND APPARATUS FOR ULTRA-LOW LEAKAGE ANALOG STORAGE

CROSS REFERENCE TO RELATED APPLICATIONS

The present application claims the benefit of U.S. Provisional Patent Application No. 60/620,911, filed on Oct. 21, 2004, which is incorporated herein by reference.

STATEMENT REGARDING FEDERALLY SPONSORED RESEARCH

The Government may have certain rights in the invention pursuant to Contract No. NSF CCR-0122419 with the NSF and N00014-02-0434 with the ONR.

BACKGROUND OF THE INVENTION

As is known in the art, many modern analog CMOS (Complementary Metal-Oxide Semiconductor) circuits employ temporary analog storage to counteract circuit offsets and store signal variables and implement adaptation and learning. Offset correction and signal storage are common applications of temporary analog storage due to their widespread use in switched capacitor circuits, and straightforward implementation is possible using only a capacitor and a MOS switch. This form of storage is a very compact, low-power, and precise storage technique, but is useful only for relatively short time scales since the OFF state leakage of the MOS switch quickly degrades the stored charge.

So-called medium-term capacitive storage cells extend the storage time of short-term cells by reducing MOS switch leakage, and are often used in adaptive circuit design. Many leakage-reduction techniques have been proposed. However, these techniques do not focus on characterizing the switch leakage as a function of terminal voltages.

Long-term cells extend the storage times of short-term cells by completely counteracting MOS leakage rather than simply reducing it. Some cells counteract leakage by periodically quantizing the capacitor voltage using some form of analog-to-digital conversion. This scheme has the disadvantages of added circuit complexity and power due to both the analog-to-digital converter and the bussing required for multiplexing the converter between cells. A further long-term storage approach is to eliminate the MOS switch altogether by employing floating-gate technology. Disadvantages of this scheme include high voltages required for writing to the cells, slow write times, and additional supporting circuitry and bussing to accomplish the writing.

SUMMARY

The present invention provides an analog storage cell having a switch to minimize leakage current. In general, the switch minimizes subthreshold conduction and diode leakage, as well as an accumulation-mode coupling mechanism to minimize overall switch leakage. With this arrangement, leakage performance can be significantly enhanced over previously known designs. While the invention is primarily shown and described in conjunction with certain transistors and switch configurations, it is understood that the invention is applicable to circuits in general in which it is desirable to minimize leakage currents.

In one aspect of the invention, an analog storage cell circuit includes a sample and hold circuit including an amplifier having first and second inputs, a sampling capacitor, a sample phase and a hold phase, and a switch coupled to the first input of the amplifier. In one embodiment, the switch includes a first switching device forming a core of the switch, a second switching device coupled to the first switching device to disconnect the first switching device from a first terminal during the hold phase, and a third switching device coupled to the first switching device to connect the first switching device to a second terminal during the hold phase to minimize accumulation mode conduction in the first switching device. In one particular embodiment, the first terminal corresponds to an output of the amplifier and the second terminal corresponds to a supply voltage.

The cell circuit can further include a further switching device coupled between the first switching device and the first input of the amplifier to provide charge injection cancellation for the first switching element where the cell circuit has a single-sided structure. In one embodiment, the cell circuit has less than 45 aA leakage with a single-sided structure.

In another aspect of the invention, the analog storage cell circuit has a differential configuration. In one embodiment, the cell circuit has less than 10 aA leakage at room temperature.

In a further aspect of the invention, a method includes coupling, to form an analog storage cell circuit, a switch to a sample and hold circuit, the switch including a first switching device forming a core of the switch, a second switching device coupled to the first switching device to disconnect the first switching device from a first terminal during the hold phase, and a third switching device coupled to the first switching device to connect the first switching device to a second terminal during the hold phase to minimize accumulation mode conduction in the first switching device.

BRIEF DESCRIPTION OF THE DRAWINGS

The foregoing features of this invention, as well as the invention itself, maybe more fully understood from the following description of the drawings in which.

DETAILED DESCRIPTION

Before describing the invention in detail, some introductory information is presented. Medium-term analog storage cells achieve extended hold times by reducing the MOS-switch leakage current that degrades the cell's capacitively held charge. The lowest-leakage storage cell implementations have employed several different techniques to reduce switch leakage. These techniques are briefly reviewed below, and then a unified framework for comparing the performance of past implementations, which were fabricated in various technologies, is introduced.

Figure 1A:
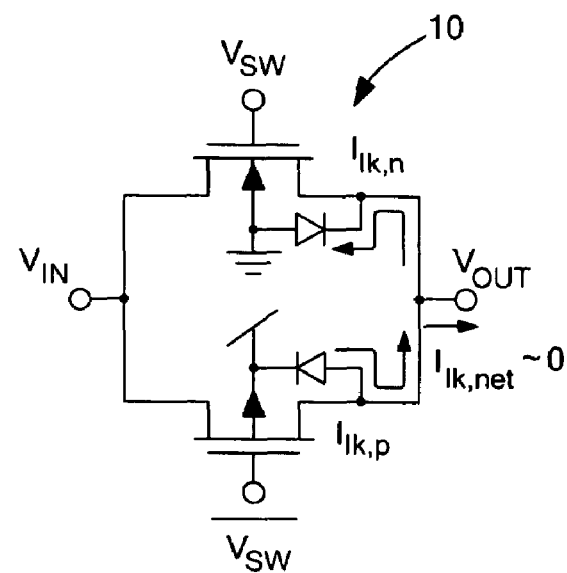
FIG. 1A is a schematic diagram of a prior art MOS switch.
Figure 1B:
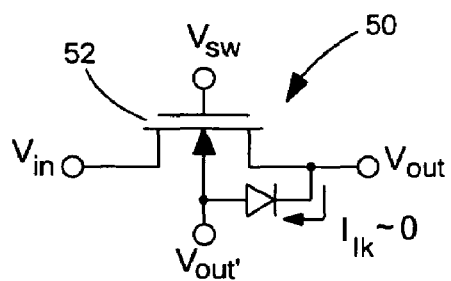
FIG. 1B is a schematic diagram of a further prior art switch.

FIGS. 1A and 1B show known low-leakage MOS switches used in analog storage cells. FIG. 1A shows a transmission gate switch 10 and two leakage currents, $I_{lk,n}$ and $I_{lk,p}$, that can flow to $V_{out}$ even when the switch is off. Leakage current $I_{lk,n}$ flows from $V_{out}$ to ground through the NMOS drain-to-bulk diode and $I_{lk,p}$ flows from $V_{DD}$ to $V_{out}$ through the PMOS drain-to-bulk diode. Since only the difference between these two leakage currents, $I_{lk,net}$, reaches $V_{out}$, it is possible to ratio the junction areas to counterbalance these leakages to the first order.

Note that a given junction area ratio minimizes the net leakage for only one particular value of $V_{out}$, however typical high-performance storage cell topologies ensure this voltage remains fixed, independent of the stored analog voltage, allowing the area ratio to be optimized for one value of $V_{out}$. This structure can be implemented in 2 μm CMOS exhibiting a net leakage current of 1 fA (all currents are inferred from measured memory cell voltage leakage rates and storage capacitor sizes). It is known that the same structure implemented in 1.2 μm CMOS yields 4.5 fA of leakage current, while a fully differential storage cell, which only responds to differential leakage, can use a pair of these low-leakage transmission gates to achieve a net differential leakage of 0.08 fA.

A second known low-leakage switch topology 50 is shown in FIG. 1B. The switch 50 is formed by a single transistor 52, in this case an NMOS transistor, fabricated inside a well to allow the transistor bulk voltage to differ from the substrate voltage. A disadvantage of this switch is that it lacks the rail-to-rail input-output range of a transmission gate. However, as was mentioned above, typical storage cell topologies force $V_{out}$ to remain constant rendering this limitation irrelevant as long as $V_{out}$ is chosen within the allowable range of the switch. Additionally, with $V_{out}$ constant, the bulk can be driven with an identical voltage $V'_{out}$ to minimize the drain-to-bulk diode leakage. NMOS versions of this low-leakage switch structure have been used in a fully differential storage cell implemented in 3-μm CMOS. The cell also attempts to minimize subthreshold leakage by driving the transistor gates below the bulk to turn them off and achieves a typical net differential leakage of 1.6 fA.

It is instructive to compare these measured leakages with estimates of what could theoretically be achieved in each technology. Suppose the switch is implemented using a single minimum-sized MOS transistor and all MOS-related switch leakage, such as subthreshold conduction, is eliminated. Then the only remaining leakage would be due to the drain-to-bulk junction diode. The fully reverse-biased leakage per unit area of this junction in a modern process is roughly 0.02 fA/μm² at room temperature, with this value having decreased by a factor of two to three in the past ten years as technology has improved. Using appropriately scaled versions of this nominal leakage parameter for older processes, the estimated leakage of a minimum-sized ($6_\lambda \times 5 \lambda$ in MOSIS scalable design rules) reverse-biased drain-to-bulk diode in each technology of interest is calculated in Table I below.

TABLE I

ESTIMATED REVERSE-BIAS LEAKAGE CURRENT OF MINIMUM-SIZED DRAIN-TO-BULK JUNCTIONS FOR SEVERAL TECHNOLOGIES. THE PRE-CONSTANTS IN THE LEAKAGE PER UNIT AREA COLUMN ARE INCLUDED TO ROUGHLY ACCOUNT FOR TECHNOLOGY AGE

| Technology | Lambda (λ) | Minimum Junction Area (6 λ × 5 λ = 30 λ²) | Scaled Reverse-Biased Junction Leakage Per Unit Area | Total Estimated Junction Leakage |
|---|---|---|---|---|
| 3 μm | 1.5 μm | 67.5 μm² | 4 × (0.02 fA/μm²) | 5.4 fA |
| 2 μm | 1 μm | 30 μm² | 3 × (0.02 fA/μm²) | 1.8 fA |
| 1.5 μm | 0.75 μm | 16.9 μm² | 2 × (0.02 fA/μm²) | 0.68 fA |
| 1.2 μm | 0.6 μm | 10.8 μm² | 2 × (0.02 fA/μm²) | 0.43 fA |

Before these estimates of nominal leakage current can be compared to the measured results from above, the leakage-reduction techniques employed in each implementation should be taken into account. The following assumptions will be made about the effectiveness of the techniques employed. It will be assumed that both counterbalancing NMOS and PMOS leakages and implementing the storage cell differentially achieve 80% matching accuracy, and therefore applying either technique will reduce the leakage to 20% of its starting value. Drain-to-bulk voltage minimization is typically accomplished using an amplifier in feedback, and therefore brings the two terminals no closer than the input-offset voltage of the amplifier employed, which will be assumed to be 5 mV. This level of bias across the diode can be shown to yield an 80% reduction in diode current when compared to full reverse-bias.

Applying the relevant reduction factors from above to the nominal reverse-biased diode leakages from Table I, a conservative upper bound on the leakage current expected in each implementation is calculated in Table II below. Also listed in the table are the currents that were measured in each implementation, which in all cases are at least 2.5 times larger than the generous estimates of the leakage upper bounds. These results suggest that additional leakage mechanisms, probably due to the MOS structure, exist and have not been compensated for in these implementations.

TABLE II

ESTIMATED UPPER BOUND ON LEAKAGE AND ACHIEVED LEAKAGE FOR THREE MEMORY CELLS

| Compensation Methods | Estimated Junction Leakage (From Table I) | Scaling Factor | Estimated Net Leakage | Achieved Net Leakage |
|---|---|---|---|---|
| Technology | | | | |
| 3 μm  Minimum Drain-to-Bulk Voltage; Differential | 5.4 fA | (0.2)(0.2) | 0.22 fA | 1.6 fA |
| 2 μm  N & P Counterbalance | 1.8 fA | (0.2) | 0.36 fA | 1 fA |
| 1.2 μm  N&P Counter-balance; Differential | 0.43 fA | (0.2)(0.2) | 0.017 fA | 0.08 fA |

The dominant sources of leakage in MOS devices can be characterized in a standard 1.5-m CMOS n-well double-poly process. The goal of these measurements is to establish a list of guidelines that should be followed to achieve minimum switch leakage and thus maximum storage times with a given capacitance. The measurements also reveal a MOS leakage mechanism.

Direct measurement of sub-pA level currents is tedious to perform in the laboratory, even with a sufficiently accurate electrometer. At these current levels, the resistance of many common laboratory insulators is non-negligible, requiring careful design of the entire test setup to ensure insulator leakage does not affect the measurement. Additionally, external electrical interference must be completely eliminated as even faint signals can easily corrupt the measurement. Within an integrated circuit, however, fA-level currents can be accurately conveyed across the die and the entire die can be shielded from interference by placing it in a grounded metal box. Because of this, measuring MOS leakage currents using on-chip circuitry can yield a level of accuracy that may be difficult to achieve with an off-chip electrometer. As was alluded to earlier, capacitive current integration offers a simple on-chip mechanism for indirectly measuring low current levels. It avoids off-chip error sources by first time-integrating the small current within the low-noise on-chip environment to yield voltage movements of a sufficient magnitude that they can be reliably measured in the relatively noisy off-chip environment.

Figure 2:
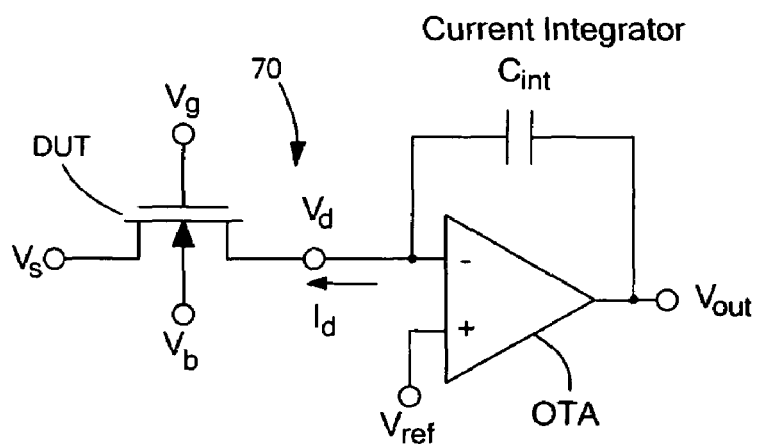
FIG. 2 is a schematic diagram of a MOS leakage test structure.

FIG. 2 shows an exemplary current-integrator leakage tester having an integrating capacitor $C_{int}$ and a PMOS-input fully cascoded wide-output swing operational transconductance amplifier OTA. In the illustrative embodiment, the device under test (DUT) is an NMOS transistor, but the same structure can also be used to characterize PMOS leakage. The current-integrator topology, when built using a high-gain amplifier, possesses several features related to the operation of the leakage tester. For example, the negative input terminal of the OTA servos to $V_{ref}$ (plus the OTA's input-offset voltage) as long as the amplifier output is not railed, which allows for indirect control of $V_d$, the DUT drain voltage. Further, any current $I_d$ that flows into the DUT drain will be immediately integrated on $C_{int}$, causing a change in $V_{out}$ but virtually no change in $V_d$. Also, the rate of change of $V_{out}$ is related to $C_{int}$ as shown in Equation 1 below independent of capacitances from $V_d$ and $V_{out}$ to ground.

$$\left[\frac{dV_{out}}{dt}\right] = \frac{I_d}{C_{int}} \qquad \text{Eq. (1)}$$

In addition, a constant-current load at the integrator output due to an off-chip instrument monitoring $V_{out}$ causes only a constant voltage offset error, which has no effect on the measured $dV_{out}/dt$.

Using the leakage tester presented above, the DUT drain current can be evaluated as a function of the four MOS terminal voltages by iteratively applying the following procedure. At the start of each test run, initialize the leakage tester so that the four terminals of the DUT are at the required test voltage levels, and the output of the integrator sits halfway between the circuit rails, at $V_{DD}/2$. This initialization is accomplished by temporarily using the DUT as a switch to reset the voltage across $C_{int}$. After initialization, measure the time rate-of-change of $V_{out}$ with an off-chip electrometer. Using this slope measurement and the value of $C_{int}$, the current $I_d$ can be indirectly evaluated using Equation 1 above.

In order to obtain accurate results with the leakage tester, $C_{int}$ must be accurately known. Therefore, a capacitor calibration structure was implemented on each of the test die using two package pins, $P_A$ and $P_B$, with nominally identical package-related capacitances. Pin $P_A$'s associated die-level bond pad was connected to the top plate of a calibration capacitor $C_{cal}$ whose layout is identical to that of $C_{int}$. The bottom plate of $C_{cal}$ was grounded. Pin $P_B$'s associated die-level bond pad was not connected to any other die-level structure. By measuring the difference in capacitance between pins $P_A$ and $P_B$, an estimate of $C_{cal}$ (and thus $C_{int}$) can be obtained that should be independent of package and die-level parasitic capacitances to first order. Using this calibration structure and an LCR meter, the fabricated values of $C_{int}$ were all measured in the range 6.072 pF±0.04 pF. The median value of $C_{int}$=6.072 pF was used to infer the leakage data.

Transistor drain leakage is typically modeled as the combination of two separate phenomena: diode leakage and subthreshold conduction. Drain-to-bulk diode leakage for non-zero drain-to-bulk voltages was discussed above and illustrated in FIG. 1A-B. In an NMOS, this current can be modeled to first order by the ideal diode equation set forth below in Equation 2.

$$I_{DB} = -I_s[e^{-V_{DB}/V_t} - 1] \qquad \text{Eq. (2)}$$

where $I_{DB}$ is the diode current and $V_{DB}$ the applied voltage, $I_s$ is the diode saturation current and is a constant proportional to a linear combination of the junction area and perimeter, and is the thermal voltage (roughly 26 mV at T=300K).

The second source of leakage is due to subthreshold conduction. Equation 3 below describes the drain-to-source current, $I_{DS}$, of a subthreshold ($V_{GS} \ll V_{TS}$) NMOS transistor:

$$I_{DS} = I_{os}\frac{W}{L}e^{-\kappa V_{TS}/V_t}e^{\kappa V_{GS}/V_t}(1 - e^{-V_{DS}/V_t}) \qquad \text{Eq. (3)}$$

where $I_{OS}$ is a process-dependent current-scaling constant, $V_{TS}$ is the transistor's threshold voltage, W/L is its width over length ratio, and $\kappa$ is a parameter that is a function of the applied source-to-bulk voltage and has a magnitude less than one. The threshold voltage $V_{TS}$ is defined by the body-effect relation express in Equation 4.

$$V_{TS} = V_{TO} + \gamma(\sqrt{\phi_0 + V_{SB}} - \sqrt{\phi_0}) \qquad \text{Eq. (4)}$$

The threshold voltage $V_{TS}$ is a function of the nominal threshold voltage $V_{TO}$, which is fixed for a given technology, the applied source-to-bulk voltage, $V_{SB}$ and $\gamma$ and $\phi_0$, which are process-dependent parameters.

Since the drain leakage is the sum of these two leakage mechanisms, subthreshold conduction can be made negligible by reducing $V_{GS}$ until $I_{DS} \ll I_{DB}$. The $V_{GS}$ at which this happens has several dependencies. For example, it is a weak function of $I_{DB}$—if the diode leakage is reduced $V_{GS}$ must decrease to ensure that subthreshold conduction remains small enough to be ignored. In addition, it depends linearly on the transistor's nominal threshold voltage since $I_{DS}$ is a function of the difference between $V_{GS}$ and $V_{TS}$. Therefore, as the threshold voltages of modem processes decrease to enable low-voltage design, the $V_{GS}$ at which subthreshold conduction can be ignored is steadily decreasing. The net result of this trend is that in most modem processes the subthreshold current and diode leakage equalize at a $V_{GS} < 0$. Due to this effect, most modem NMOS transistors that are digitally OFF ($V_{GS} = V_{SB} = 0V$) but have nonzero $V_{DS}$ will conduct with a level of $I_{DS}$ several orders of magnitude larger than $I_{DB}$.

Figure 3:
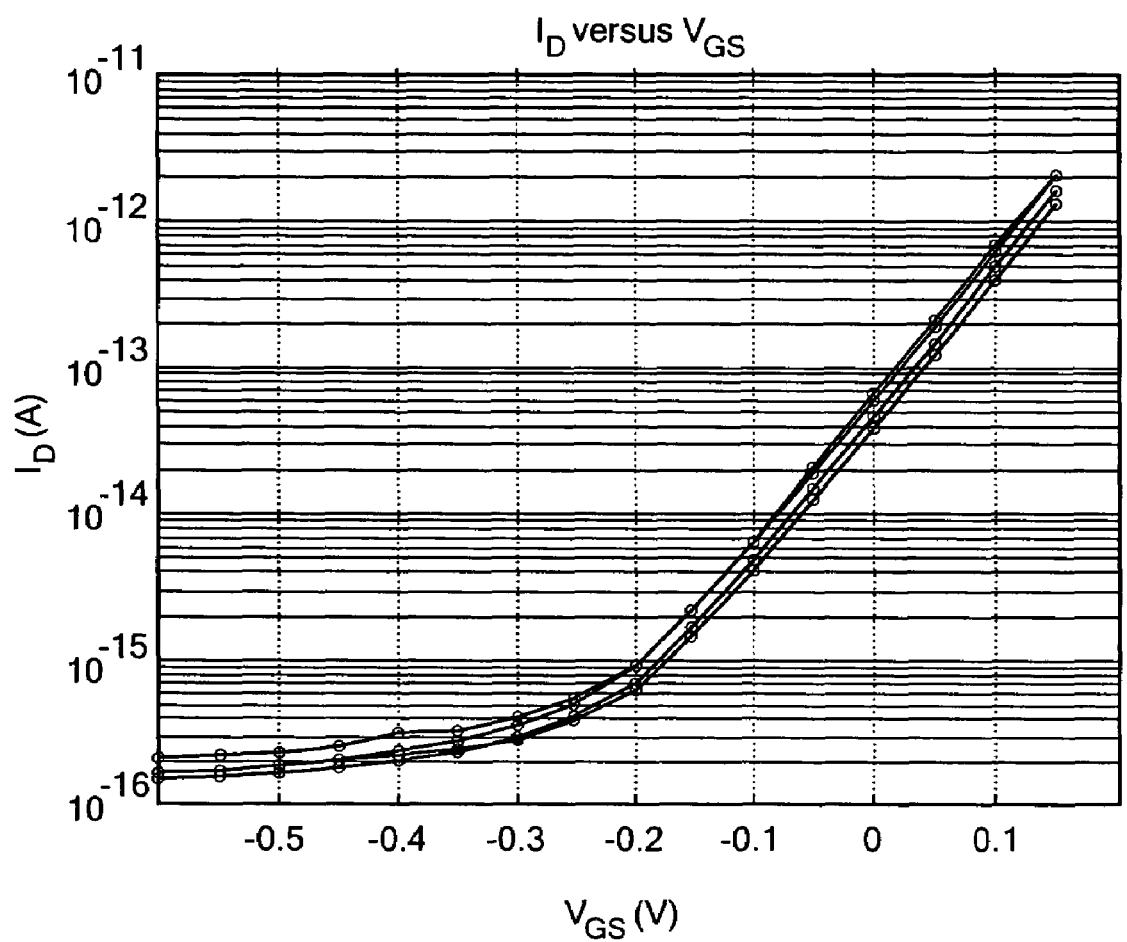
FIG. 3 is a graphical depiction of $I_D$ versus $V_{GS}$ for five NMOS switches.

The tradeoff between diode leakage and subthreshold conduction outlined above appears to be experimentally verified in FIG. 3. This figure shows the measured $I_D$ versus $V_{GS}$ characteristics of five different minimum-sized NMOS transistors with $V_S = V_B = 0V$ and $V_{DS} = 150$ mV. The current $I_D$ (always referenced with respect to the direction shown in FIG. 2) varies exponentially with the gate-to-source voltage from $V_{GS} > -200$ mV indicating subthreshold conduction dominates in this region, and remains roughly constant for $V_{GS} < -400$ mV where diode leakage apparently dominates. Thus, one method of minimizing NMOS subthreshold conduction in this process is to bias $V_{GS} < -400$ mV. Note that in this particular example, the gate would have to be driven to a voltage outside the range of the existing rail voltages to avoid subthreshold conduction. An alternate method of avoiding subthreshold leakage was employed in the transmission gate switch shown in FIG. 1A. Since it is the difference between $V_{GS}$ and $V_{TS}$ that controls $I_{DS}$, subthreshold current can be reduced by increasing $V_{TS}$, or equivalently $V_{SB}$. For large enough $V_{SB}$, this technique allows subthreshold conduction to be made negligible for a level of $V_{GS} \geq 0V$. Shifting $V_s$ has the added benefit of allowing for levels of $V_{GS} < 0V$ without the need to drive the NMOS gate below the lower rail. Both of these effects alleviate the rail problem, however the disadvantage of increasing $V_{SB}$ in the case of a switch is that it also reverse-biases the drain-to-bulk diode, increasing $I_{DB}$. The options presented above for avoiding subthreshold conduction in NMOS transistors in this process are unattractive. However, if it were possible to fabricate the NMOS inside a well, the switch topology presented in FIG. 1B could be used with $V_{out}$ biased near $V_{DD}/2$ to simultaneously minimize subthreshold leakage, avoid the rail problem, and minimize drain-to-bulk leakage. One alternative in an n-well process is to implement the switch using a PMOS transistor. Before examining the leakage of a PMOS version of this switch, observations of an accumulation-mode leakage mechanism are presented below.

Equation 3 is valid only when the NMOS structure is biased in weak inversion, which was true in the above experimental data for $V_{GS} > -200$ mV. However, for $V_{GS} < -400$ mV the transistor is biased in a different region of MOS operation known as accumulation-mode. In this regime, the subthreshold mechanisms that couple the source and drain in the MOS channel are negligible. As a result, it is typically concluded the source no longer significantly interacts with the drain in accumulation mode.

Figure 4:
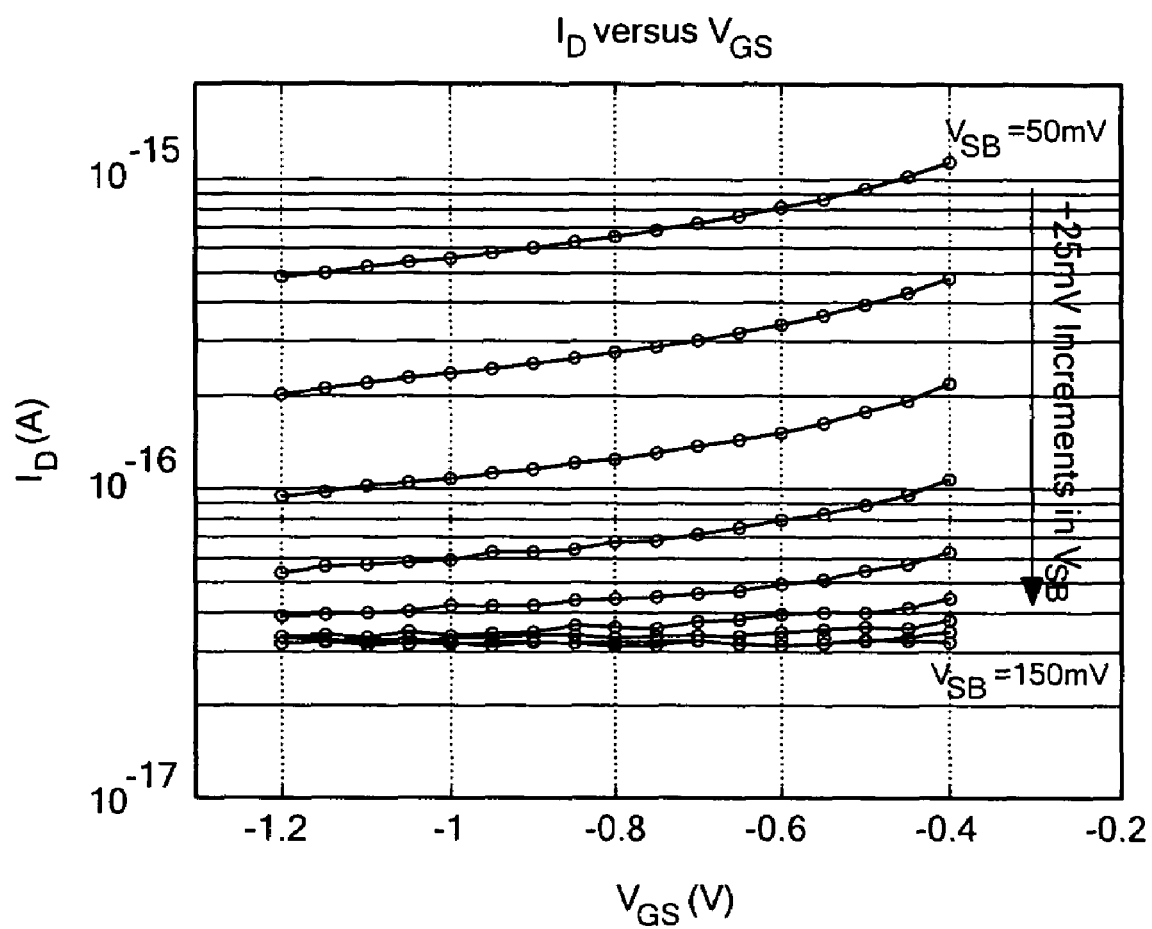
FIG. 4 is a graphical depiction of $I_D$ versus $V_{GS}$ for NMOS switches in accumulation mode.

The measurements presented in FIG. 4 not only show that this assumption is false, but that the source-drain interaction is still quite strong. In this experiment, the accumulation-mode $I_D$ versus $V_{GS}$ characteristic of a minimum-sized NMOS transistor was measured at multiple values of with $V_{SB}$ with $V_B = 0$ V and $V_{DB} = 150$ mV. The plot shows that as $V_{SB}$ approaches $V_{DB}$, the curves asymptote to a $V_{GS}$-independent drain current of $\approx 30$ aA—much lower than the apparent lower bound seen in FIG. 3.

Figure 5:
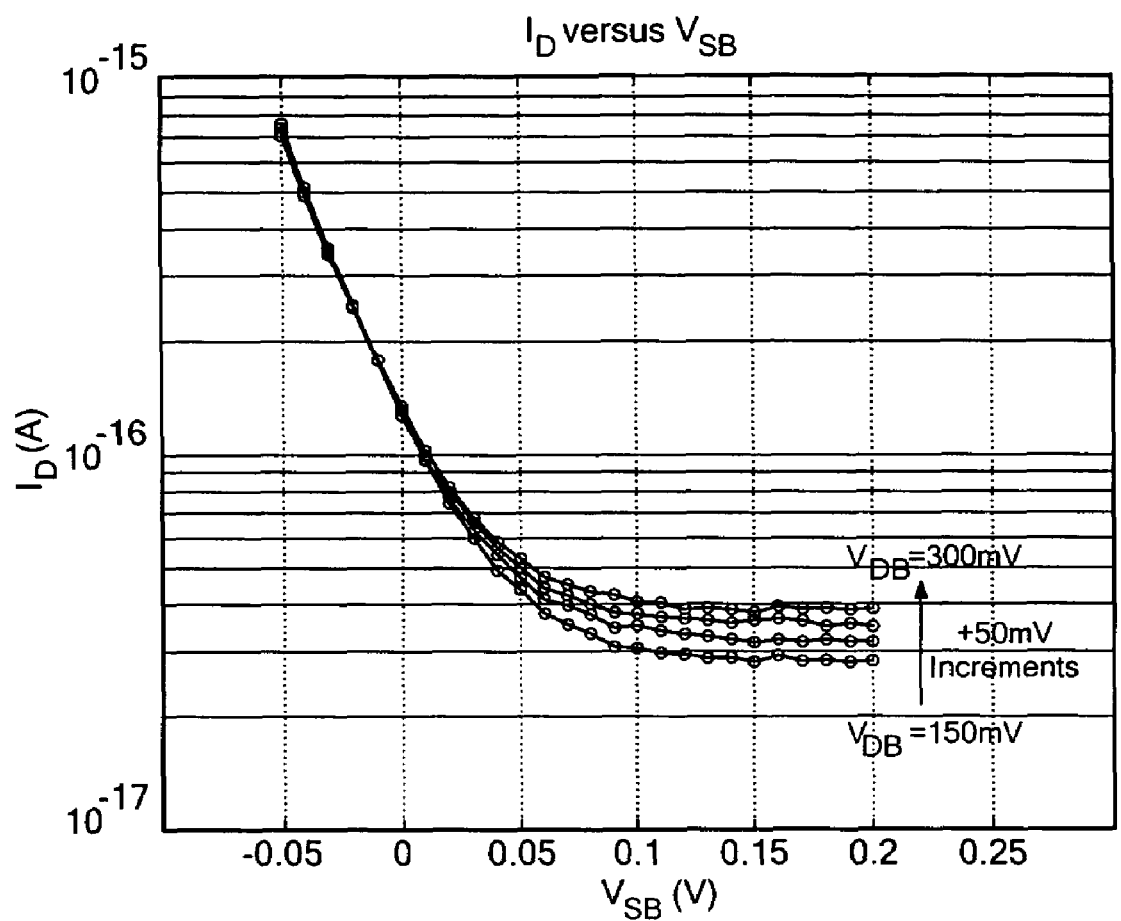
FIG. 5 is a graphical depiction of $I_D$ versus $V_{SB}$ for NMOS switches.

FIG. 5 characterizes the accumulation-mode $I_D$ versus $V_{SB}$ response of the same minimum-sized NMOS transistor at a fixed $V_{GB} = -1$ V, for multiple values of $V_{DB}$. The plots show that for $-50$ mV $\leq V_{SB} \leq 50$ mV the drain current $I_D$ still depends exponentially on $V_{SB}$, changing an order of magnitude for a 60 mV change in $V_{SB}$, but is independent of the source-to-bulk voltage for $V_{SB} > 100$ mV. Also, the residual leakage values weakly increase with $V_{DB}$, most likely due to the drain-to-bulk diode's reverse current increasing with reverse bias. Modeling this response as an ideal diode plus a drain-dependent offset current gives data fits with correlation coefficients above 0.99, suggesting that a significant component of the accumulation-mode leakage current is due to a coupling of the source-to-bulk diode current to the drain terminal. Finally, since the source and drain are symmetric terminals in the MOS transistor, the observed interaction will also be symmetric.

Figure 6:
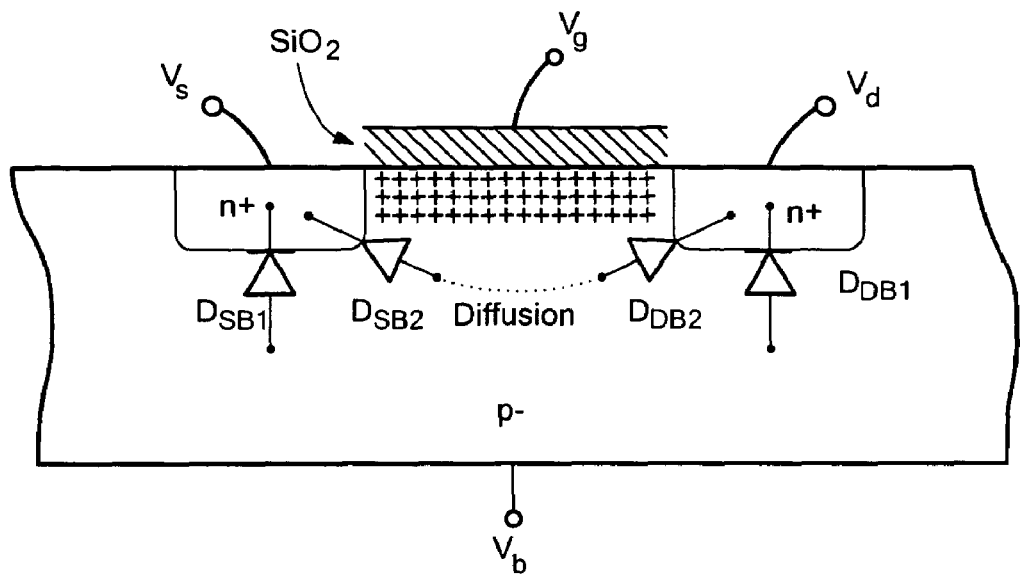
FIG. 6 is a pictorial representation of an empirical model of accumulation mode NMOS leakage sources.

An empirical model of this accumulation-mode conduction mechanism in the NMOS is shown in FIG. 6. The distributed drain-to-bulk and source-to-bulk diodes are modeled as two pairs of lumped diodes. The first diode in each pair, $D_{SB1}$ and $D_{DB1}$ are lumped models of the portions of the distributed diodes that only interact with the bulk. The second diode in each pair, $D_{SB2}$ and $D_{DB2}$, represent the portions of these distributed diodes that only interact with the opposite MOS terminal. It is postulated that the mechanism linking these two diodes is carrier diffusion under the accumulation layer. This theory is bolstered by the fact that in FIG. 4 the drain current in the upper curves decreases as $V_{GS}$ becomes more negative. The empirical model explains this behavior as a reduction in the cross-sectional areas of $D_{DB2}$ and $D_{SB2}$ due to the increasing depth of the accumulation layer with decreasing $V_{GS}$.

A second interpretation of this empirical model is to view the coupled diodes $D_{DB2}$ and $D_{SB2}$ as a single symmetric lateral bipolar transistor acting between the source, bulk, and drain terminals. A detailed device-physics-based characterization of this leakage mechanism could be developed based on either of these equivalent views. However, since one goal is to understand how to minimize MOS leakage, a simple rule-of-thumb for avoiding this leakage mechanism is offered and the effect is not characterized further.

From the symmetry of the empirical leakage model, it is expected that the accumulation-mode source/drain interaction can be minimized by ensuring that $V_{SB} = V_{DB}$. Under these conditions, the currents flowing in $D_{DB2}$ and $D_{SB2}$ will be equal in magnitude and opposite in direction, summing to zero like in traditional subthreshold conduction or symmetric lateral bipolar conduction. This was previously observed in FIG. 4 for $V_{DB} = V_{SB} = 150$ mV, and resulted in a residual leakage due to only $D_{DB1}$. Additionally, if either (or both) $V_{SB}$ or $V_{DB} > 100$ mV, the model predicts the net leakage from that node will depend on the node voltage only weakly through the diode's reverse-bias current dependence on reverse-bias voltage, as seen in FIG. 5. The implications of the accumulation-mode leakage effect on the switch topology of FIG. 1B are clear. In this switch, $V_{DB}$ is intentionally biased as close to 0 V as possible to minimize the drain-to-bulk diode leakage. Thus, to ensure that the accumulation-mode conduction mechanism characterized above does not dominate diode leakage when the switch is turned off, it is require that $V_{SB}=V_{DB}=0V$.

Figure 7:
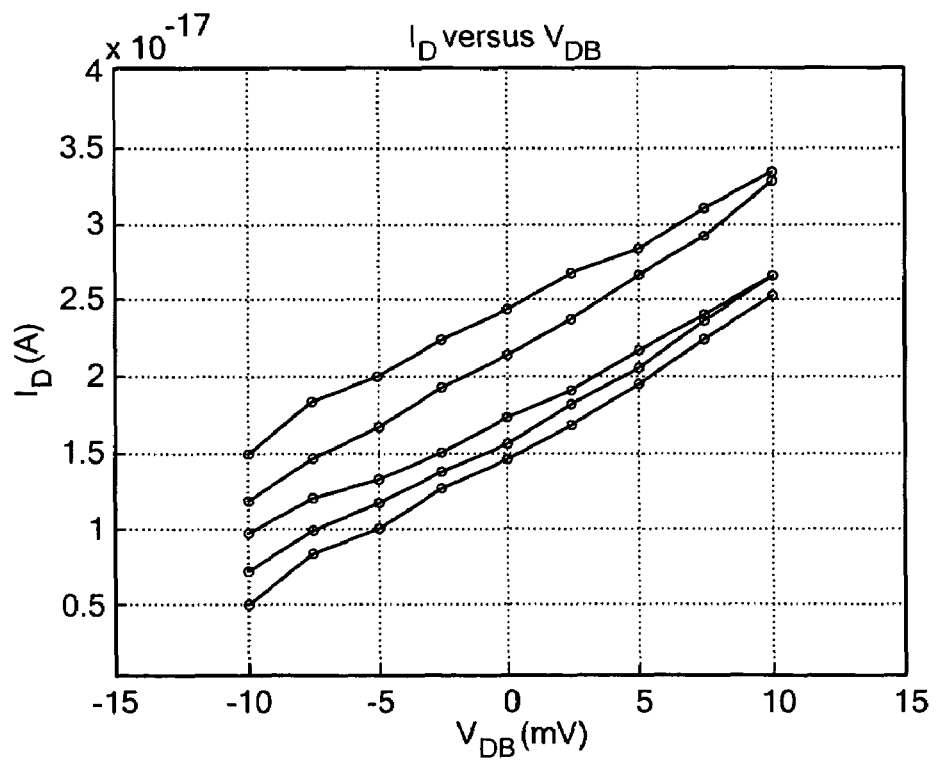
FIG. 7 is a graphical depiction of $I_D$ versus $V_{DB}$ for five PMOS switches.

Further measurements characterize the leakage of a PMOS version of the switch topology shown in FIG. 1B. The measured $I_D$ versus $V_{DB}$ curves of five minimum-sized PMOS transistors are shown in FIG. 7 for $-10$ mV$\leq V_{DB}\leq 10$ mV, with $V_{SB}=0$ V, a bulk-to-substrate voltage of $V_{B\text{-}sub}=1.65$ V, and $V_{G\text{-}sub}=V_{DD}=3.3$ V. These bias voltages eliminate subthreshold conduction, minimize drain-to-bulk diode leakage, and minimize accumulation-mode conduction. The leakage is characterized as a function of $V_{DB}$ because this voltage will eventually depend on a random amplifier offset, much like it did in the leakage tester of FIG. 2. Thus, the sweeps shown in FIG. 7 represent the range of leakages that most likely will be encountered in a storage cell using a minimum-sized PMOS transistor as a switch.

One result seen in FIG. 7 is the nonzero current when $V_{DB}=0V$. This highlights an additional leakage mechanism unique to transistors fabricated inside wells. In these transistors, the well-to-substrate junction can interact with the drain through minority carrier diffusion, just as the source-to-bulk junction does in accumulation-mode. Equivalently, this leakage can be viewed as the result of a vertical bipolar transistor acting between the drain, well, and substrate terminals. Since the well-to-substrate junction is heavily reverse-biased and the drain-to-well junction is not, a net differential leakage current flows from the drain to the substrate, accounting for the observed offset. This theory is supported by measurements showing this offset leakage approaches zero as $V_{B\text{-}Sub}$ approaches 0 V.

Figure 8:
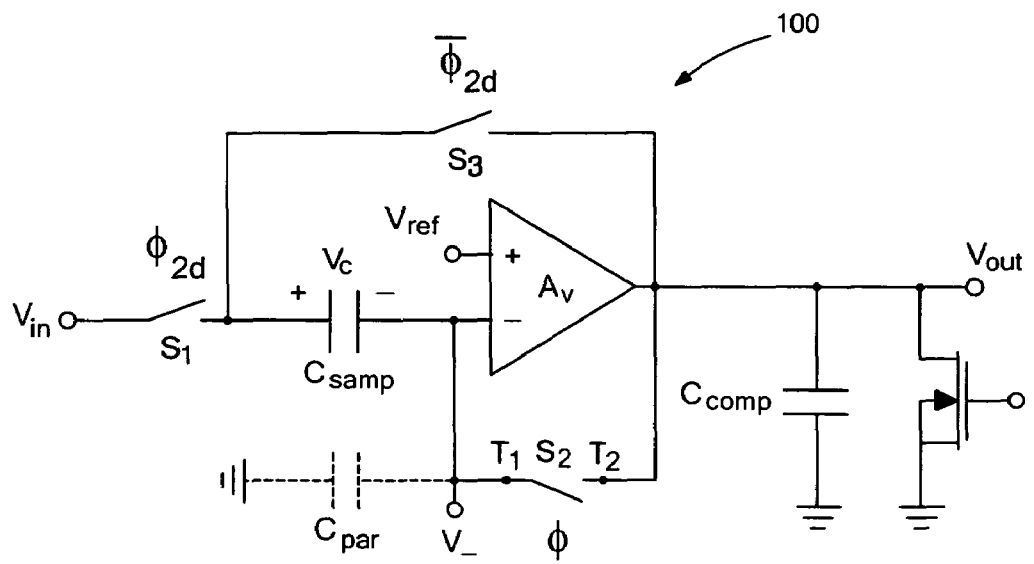
FIG. 8 is a high-level schematic diagram of a switched-capacitor storage cell.

FIG. 8 shows a top-level view of the single-sided switched-capacitor storage cell 100. The cell 100 includes a high-accuracy sample-and-hold circuit. The analysis of cell operation that follows ignores switch charge injection and device noise, but these error sources will be considered below. Additionally, for the moment ignore $C_{comp}$ and assume that $V_{reset}=0$ V.

The sampling phase of circuit operation occurs while the digital signals $\phi$ and $\phi_{2d}$ (a delayed version of $\phi$ that occurs 2d later in time) are both high and/$\phi_{2d}$ is low. Under these conditions switches $S_1$ and $S_2$ are closed and switch $S_3$ is open. This ties the amplifier in unity-negative feedback and connects $V_{in}$ to the left side of the sampling capacitor $C_{samp}$. The net voltage applied across $C_{samp}$ during this phase is $V_C=V_{in}-(V_{ref}+V_{off})$, where $V_{off}$ is defined to be the offset between the negative and positive terminals of the amplifier in this unity-negative feedback configuration. At the instant in time when $\phi$ switches from high to low, switch $S_2$ opens and the sampling phase ends. Assuming zero charge injection from $S_2$ into the virtual ground node of the amplifier, the voltage held across $C_{samp}$ is described in Equation 5 below.

$$V_{C,\,sampled}=V_{in,sampled}-(V_{ref}+V_{off}). \qquad \text{Eq. (5)}$$

Note that if there is a nonzero parasitic capacitance $C_{par}$ at the V_ node, the capacitor divider formed by $C_{sap}$ and $C_{par}$ allows movements in $V_{in}$ to alter $V_{C,sampled}$ even after $S_2$ opens. However, because of the capacitive divider, V_ is also forced to move in proportion to $V_{in}$. When switch $S_3$ eventually closes and the hold phase begins the resulting negative feedback loop will force V_ to return to a voltage nearly identical to its sampling phase value. This can happen only if the left terminal of $C_{samp}$ returns to the voltage that was present at $V_{in}$ at the instant when $S_2$ opened. This independence from movements at $V_{in}$ once $S_2$ is opened is a consideration when switch topologies are chosen.

After switch $S_2$ opens and the input voltage has been sampled, the delayed control signals $\phi_{2d}$ and /$\phi_{2d}$ cause $S_1$ to open and $S_3$ to close. This connects the left terminal of $C_{samp}$ to the output of the amplifier, $V_{out}$, configuring the circuit in the same topology as the current integrator of FIG. 2 and highlighting that it is switch $S_2$ that is low-leakage. For the moment, ignore the transient behavior of the circuit after $S_3$ closes and focus on the final dc voltages that will exist after the system settles in this new configuration. Negative feedback will force the virtual ground node to a hold-phase voltage set forth in Equation 6 below.

$$V_{-,hold}=V_{ref}+V_{off}+\Delta V \qquad \text{Eq. (6)}$$

where $\Delta V$ is due to the amplifier's finite open-loop dc gain $A_v$. The hold-phase output voltage is described in Equation 7.

$$V_{out,\,hold}=V_{C,\,sampled}+V_{-,hold}=V_{in,\,sampled}+\Delta V \qquad \text{Eq. (7)}$$

Using Equation 7, $\Delta V$ can be expressed in terms of the change in $V_{out}$ from the sample to the hold phase $$\Delta V = -\frac{V_{out,hold} - V_{out,samp}}{A_v} \qquad \text{Eq. (8)}$$
$$= -\frac{(V_{in,sampled} + \Delta V) - (V_{ref} + V_{off})}{A_v}$$

which simplifies to Equation 9 which gives $$\Delta V = -\frac{V_{in,sampled} - (V_{ref} + V_{off})}{(A_v + 1)} \qquad \text{Eq. (9)}$$

Since the error term $\Delta V$ causes $V_{out,hold}$ to differ from the desired held voltage $V_{in,sampled}$, the amplifier's dc gain $A_v$ must be large enough to keep $\Delta V$ tolerable at the extremes of $V_{in}$.

Figure 9:
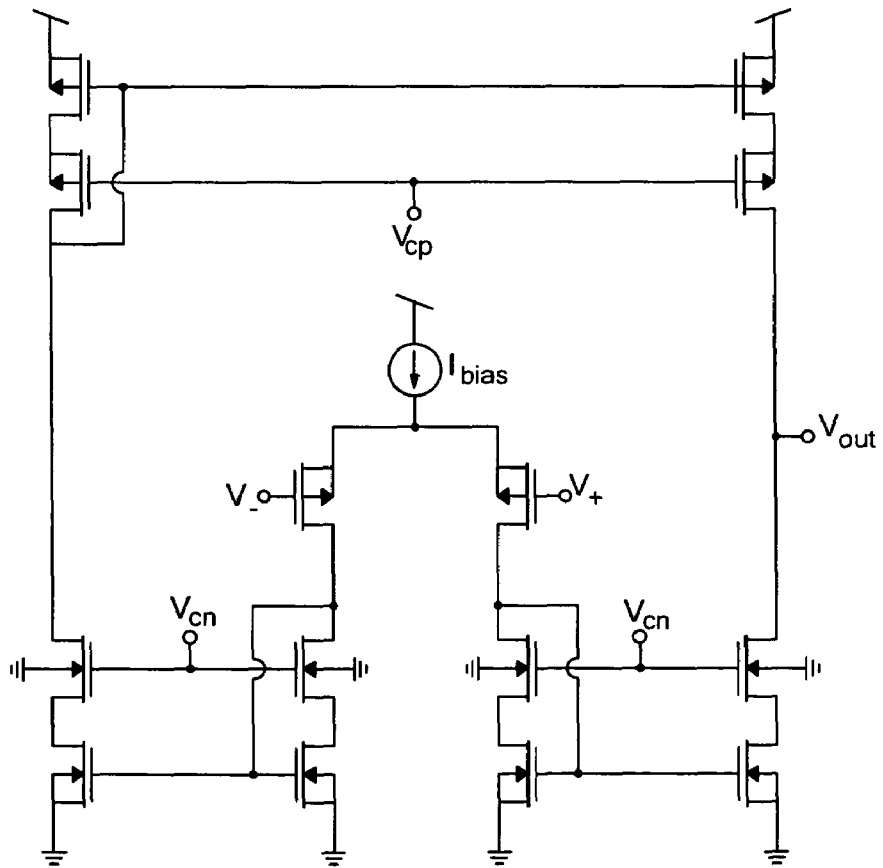
FIG. 9 is a schematic diagram of a PMOS-input cascoded wide-output swing OTA.

To this end, the amplifier was implemented as a subthreshold fully cascoded wide-output swing OTA, shown in FIG. 9, and designed with an open-loop dc gain $A_v=10^4$ V/V. Devices in the amplifier were sized with W/L=9 µm/4.5 µm. With $V_{DD}=3.3$ V and $V_{ref}=1.65$ V, Equation 9 predicting that the absolute value of the sampling error due to finite gain will be <165 µV for 0 V$\leq V_{in}\leq V_{DD}$.

When MOS switches are turned off they inject channel charge and parasitic capacitive charge into the circuit nodes attached to their drain and source. Since the stored information of the above cell is represented by the sampled charge at the virtual ground node of the amplifier, any charge injection into the virtual ground node when $S_2$ opens will alter the stored analog value. To minimize this charge injection, the standard dummy transistor compensation technique is employed in constructing $S_2$.

Figure 10A:
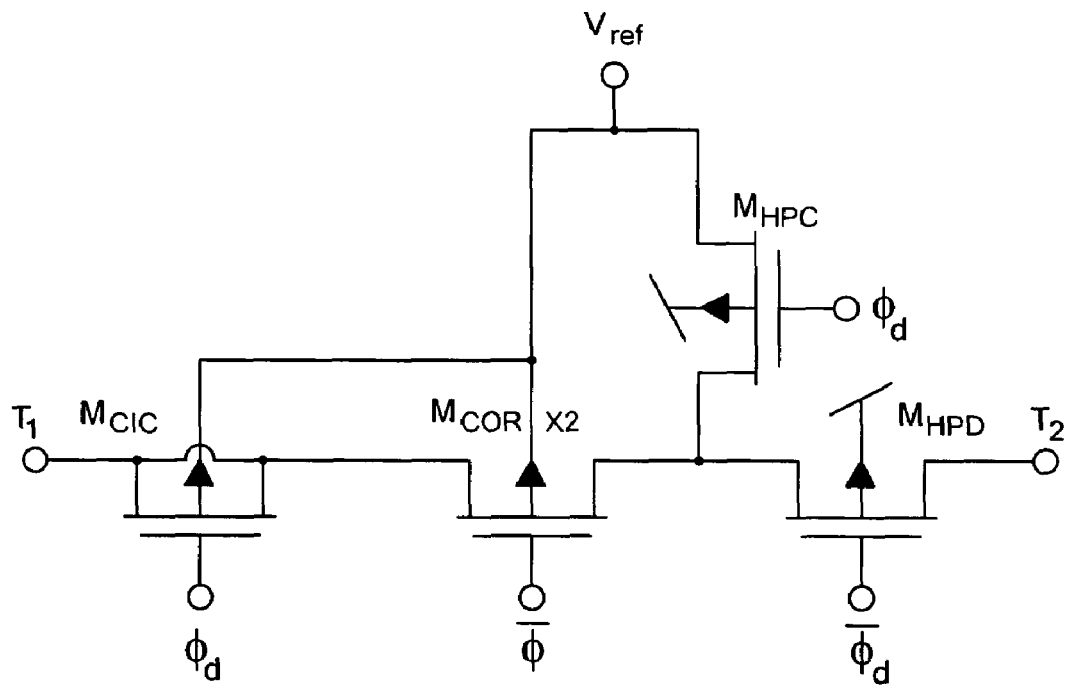
FIG. 10A is a schematic diagram of a low-leakage low-charge-injection switch for a single-sided cell.
Figure 10B:
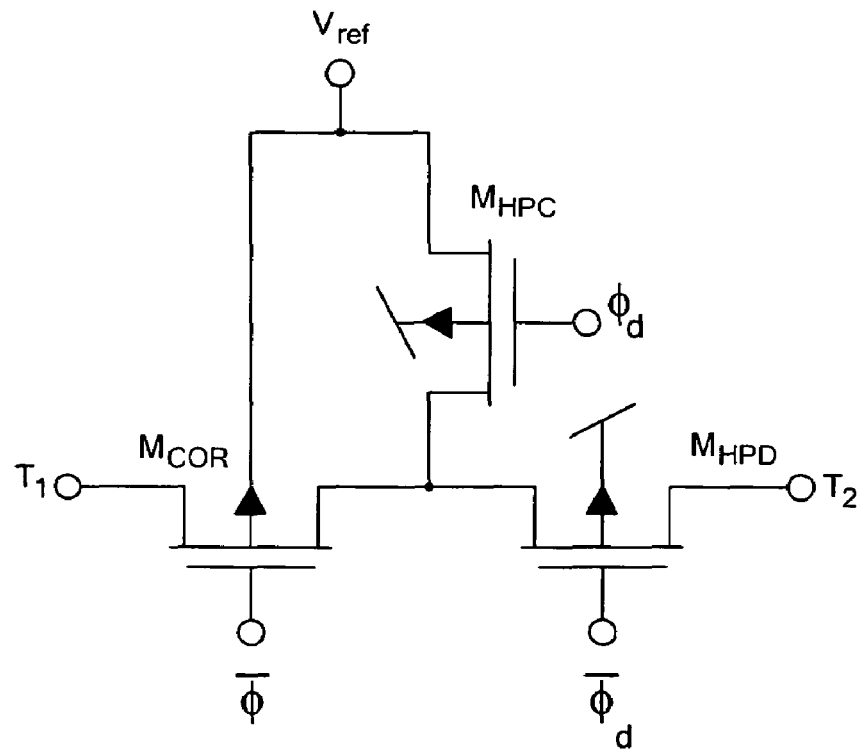
FIG. 10B is a schematic diagram of a low-leakage switch for a differential cell.
Figure 10C:
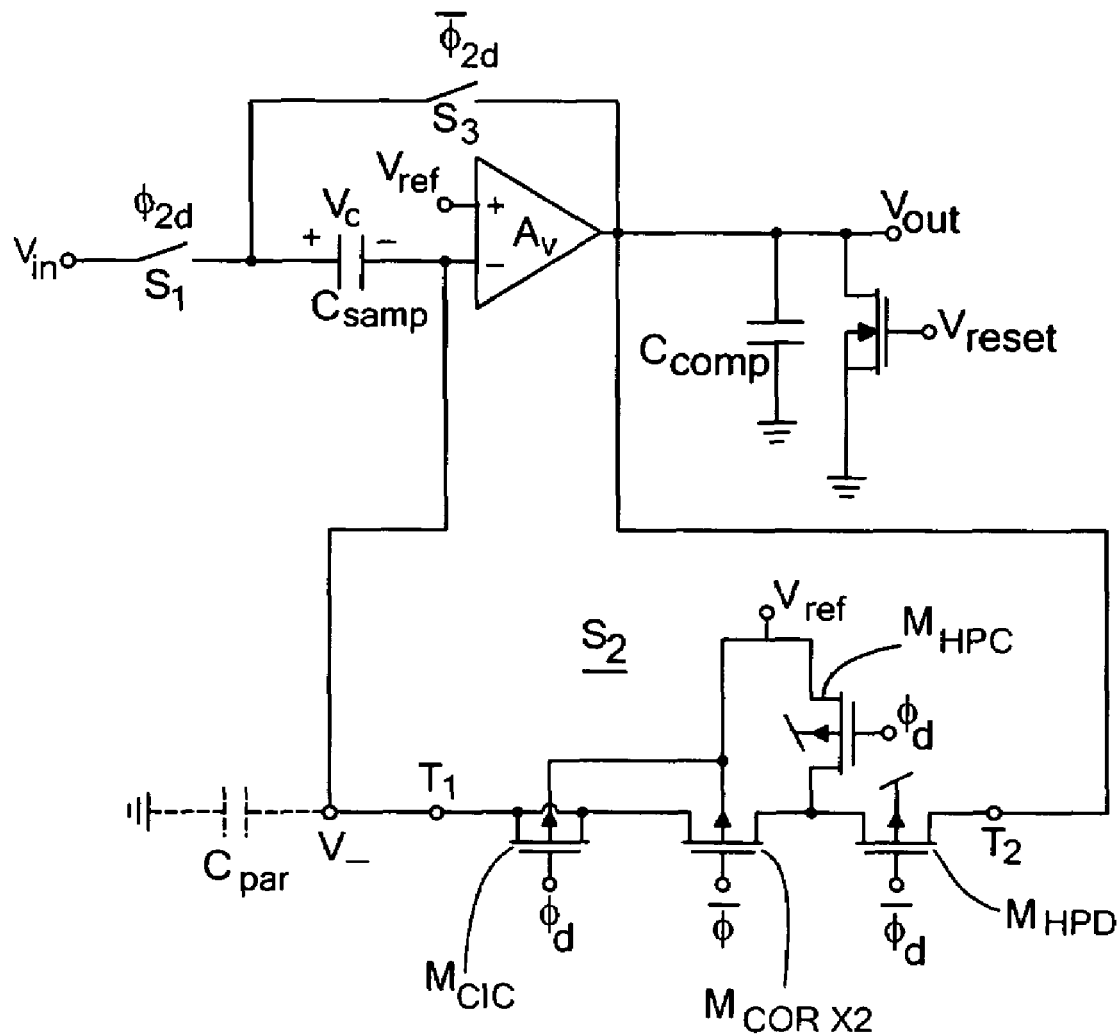
FIG. 10C shows the switch of FIG. 10A in the circuit of FIG. 8.

The inventive low-leakage, low-charge-injection switch structure used for $S_2$ is shown in FIG. 10A. FIG. 10C shows the switch $S_2$ in the circuit of FIG. 8. Note that a single-delay version $\phi_d$ of the control signal $\phi$ is used in the switch control for reasons that will be clear when the transient response is discussed. Referring to FIG. 8, terminal $T_1$ connects to V_ while terminal $T_2$ connects to $V_{out}$. Transistor $M_{COR}$ forms the core of the switch and is the PMOS equivalent of the low-leakage NMOS switch of FIG. 1B. Transistor $M_{CIC}$ implements charge-injection cancellation by nominally extracting the same charge from the virtual ground node as $M_{COR}$ injects into the node, and is delayed appropriately. The bulks of both of these devices are biased at $V_{ref}$ as this is the best available estimate of the voltage that will be present at $T_1$ during the hold phase of the cell. This minimizes the deterministic component of the source/drain-to-bulk diode voltages of $M_{COR}$ and $M_{CIC}$, but does not counteract the random amplifier input-offset voltage $V_{off}$ or the input-dependent offset $\Delta V$. Choosing $V_{ref}$ significantly below $V_{DD}$ also ensures that $M_{COR}$ is biased deep in accumulation-mode when it is off, minimizing its subthreshold conduction. Transistor $M_{HPD}$ disconnects the source of $M_{COR}$ from $V_{out}$ during the hold phase so that $M_{HPC}$ can connect this node to $V_{ref}$, minimizing accumulation-mode source-drain conduction in $M_{COR}$. Transistor $M_{HPD}$'s bulk is biased at $V_{DD}$ to ensure that this transistor's drain-to-bulk diode cannot be forward biased by a high level at during the hold phase. The bulk of $M_{HPC}$ can be biased at either $V_{DD}$ or $V_{ref}$, whichever is more convenient during layout.

It should be noted that past switch designs have also biased $M_{COR}$ deep in accumulation-mode when it is off to minimize subthreshold conduction, and have minimized $M_{COR}$'s drain-to bulk diode voltage to minimize diode leakage. It is the novel addition of $M_{HPC}$ and $M_{HPD}$ combined with the switching and biasing scheme employed that minimizes accumulation-mode conduction in $M_{COR}$ and allows this switch to achieve even lower leakage compared to past designs.

Since movements at $V_{in}$ do not affect the cell's sampled information once $S_2$ is opened, the charge-injection of switches $S_1$ and $S_3$ do not affect the cell's sampled value. However, the leakage of these switches does introduce an additional amplifier voltage offset defined by the ratio of the leakage current to the amplifier transconductance, $I_{lk}/gm$. This offset is less than 1 µV for standard MOS switch leakages ($I_{lk}$<10 fA) and amplifier bias currents greater than 500 pA. Thus, the only restriction placed on these two switches is that they both must pass rail-to-rail voltage levels to maximize the input/output voltage range, and therefore they were implemented as minimum-sized transmission gates.

An additional sampling error can be attributed to random circuit noise, which introduces an uncertainty in the voltage applied across $C_{samp}$ during the sampling phase. When $\phi$ transitions from high-to-low, the voltage sampled across $C_{samp}$ will be the sum of the value given in Equation 5 plus the instantaneous value of this noise voltage. In this circuit the noise was determined to be dominated by the amplifier thermal noise. Since the amplifier is effectively tied in unity negative feedback during all phases of circuit operation, the total thermal noise is similar in form to that of a standard single-pole RC circuit, and is described in Equation 10 below.

$$\overline{v_n^2} = N \cdot \left(\frac{2_q 1}{g_m^2}\right) \cdot \frac{\pi}{2} \cdot \frac{1}{2\pi} \cdot \left(\frac{g_m}{C_{tot}}\right) \qquad \text{Eq. (10)}$$

where N is the effective number of devices contributing noise from the amplifier (N=8 in this amplifier), q is the electron charge, gm is kI/$V_t$ is the sub threshold transconductance of the amplifier, and $C_{tot}$ is the total effective capacitance present at the output of the amplifier. The RMS voltage noise of the circuit can be evaluated by taking the square root from Equation 10 and simplifying to get the relationship in Equation 11.

$$\sigma_v = v_{\text{RMS}} = \sqrt{\overline{v_n^2}} = \sqrt{\frac{N}{2\kappa} \cdot \frac{\kappa T}{C_{tot}}} \qquad \text{Eq. (11)}$$

where $V_{RMS}$ represents the expected standard deviation $\sigma_v$ of the noise voltage, and kT=q$V_t$. During the sampling phase $C_{tot}=C_{S_{amp}}+C_{comp}$ while during the hold phase $C_{tot}=C_{Comp}$ alone–$C_{samp}$ does not affect the hold-phase noise. Capacitor $C_{comp}$ serves the added role of increasing the loop's phase margin to 90°.

The capacitor values were chosen based on noise, charge injection, and frequency response constraints to be $C_{samp}$=2.5 pF and $C_{comp}$=2 pF. Assuming κ≈0.7, Equation 11 predicts a sampling-phase standard deviation of $\sigma_{v,s}$=72 µV, and a hold-phase standard deviation of $\sigma_{v,h}$=108 µV. Since thermal noise is Gaussian, the sampling error will lie within a ±3$\sigma_{v,s}$ window over 99% of the time. The random sampling voltage error window expected in this cell is ±3$\sigma_{v,s}$≈±210 µV. Coupled with the finite-gain and charge-injection errors, this still theoretically allows the cell to achieve 12-bit accurate sampling.

The transient response of the storage cell during its transition from the sampling phase to the hold phase requires consideration due to the topology chosen for switch $S_2$. In the case where $V_{in}$<$V_{ref}$, the voltage stored across $C_{samp}$ after $S_2$ opens will be negative. Ignoring $V_{off}$ for the moment, the voltage stored on $C_{comp}$ at the end of the sampling phase will equal $V_{ref}$. The problem occurs when switch $S_3$ connects the left terminal of $Cs_{amp}$ to the output of the amplifier, and thus to $C_{comp}$. Since $(C_{par}C_{samp}/(C_{par}+Cs_{amp}))<<C_{comp}$, the resulting capacitive divider causes $C_{comp}$'s voltage to only decrease slightly below $V_{ref}$ at the instant when $S_3$ closes. As a result, the left terminal of $C_{samp}$ transiently rises from $V_{in}$ to ≈$V_{ref}$ and the capacitive divider formed by $C_{samp}$ and $C_{par}$ forces $V_-$ above $V_{ref}$. The voltage at $V_-$ remains above $V_{ref}$ while the amplifier's output slews to the equilibrium dc output voltage determined previously in Equations 7 and 9. Referring to the diagram of $S_2$ in FIG. 10A, it can be seen that if $T_1$ is pulled above $V_{ref}$, the source/drain-to-bulk diodes of $M_{COR}$ and $M_{CIC}$ will forward bias allowing charge to flow out of $V_-$, corrupting the stored analog information.

To address the above, one embodiment includes resetting $C_{comp}$ to 0 V after $S_2$ opens, but before $S_3$ closes, which will ensure that $V_-$ is always less than $V_{ref}$ during the initial transient and amplifier slewing phases. This is accomplished using an NMOS transistor connected in parallel with $C_{comp}$, as shown in FIG. 8. The control circuitry pulses $V_{reset}$ high after $\phi_d$ has gone low but before $\phi_{2d}$ goes low, with the pulse lasting ≈200 ns. The charge injected by $S_2$'s reverse-biased diodes into $V_-$ during slewing still introduces an additional sampling offset error, but calculations show that it is negligible.

The leakage of the storage cell in FIG. 8 is expected to be significantly larger than the values measured in FIG. 7 as a result of the dummy-device charge cancellation employed in $S_2$. Referring again to FIG. 10A, this technique required $M_{COR}$ to be constructed from two parallel minimum-sized transistors and $M_{CIC}$'s source and drain to both be connected to the virtual ground node of the amplifier. This makes the source/drain-to-bulk area connected to the virtual ground node a factor of four larger than that of a minimum-sized device. Since diode saturation current $I_s$ is proportional to junction area, both the offset and slope of the leakage current of this switch will be approximately four times larger than the values measured in FIG. 7, increasing to approximately 70 aA and 4 aA/mV, respectively. The actual increase in these parameters may not be simple to predict because the mechanisms involved exhibit more intricate dependencies on junction sizing and layout geometry, but they will increase.

Figure 11:
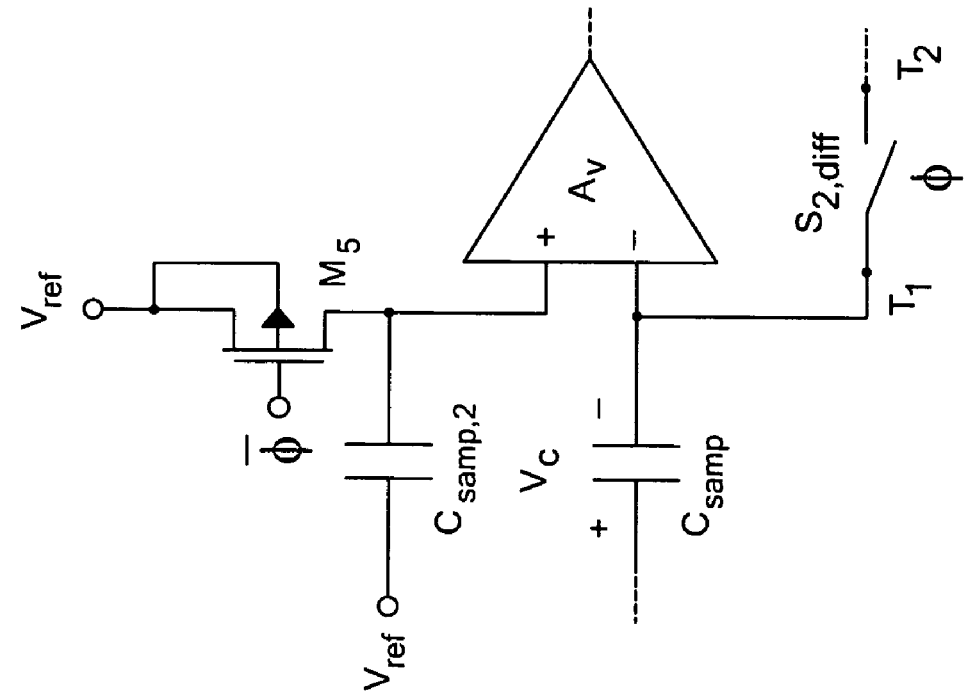
FIG. 11 is a schematic diagram of a partial differential switched-capacitor storage cell.
Figure 10D:
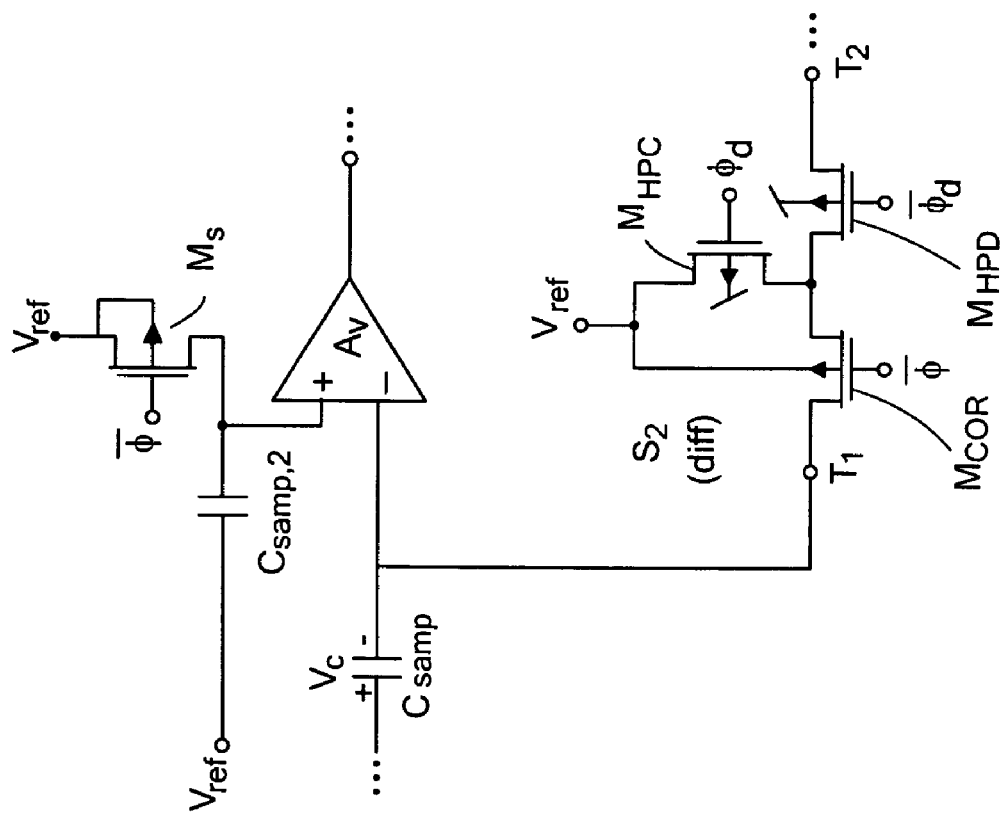
FIG. 10D shows the switch of FIG. 10B in the circuit of FIG. 11.

The estimated leakage floor of the single-sided cell can be reduced by modifying the original cell of FIG. 8 to employ differential charge-injection and leakage-cancellation techniques. The modifications to the original cell are shown in FIG. 11. First, rather than connecting $V_{ref}$ directly to the positive terminal of the amplifier, this voltage is sampled using $M_5$, a minimum-sized PMOS, onto $C_{samp,2}$ which is identical to $C_{samp}$. The left terminal of $C_{samp,2}$ could be tied to any dc voltage, but $V_{ref}$ is preferred as it is a quiet reference voltage and thus offers a high level of power supply rejection. Switch $S_{2,diff}$, shown in FIG. 10B, is a modified version of the original $S_2$ topology with transistor $M_{CIC}$ eliminated and transistor $M_{COR}$ formed from a single minimum-sized PMOS rather than two in parallel. FIG. 10D shows the switch $S_{2,diff}$ in the circuit of FIG. 11. The difference between the charge injections of $M_{COR}$ and $M_5$ onto $C_{samp}$ and $C_{samp,2}$, respectively, define the net charge injection, which should nominally be zero due to matching. Additionally, the net hold-phase leakage will be set by the difference between the leakage of and $M_5$ and $M_{COR}$, two minimum-sized PMOS transistors that are both biased in the ultra-low-leakage configuration. Assuming 80% matching, the offset component of the leakage observed in FIG. 7 should be reduced to less than ±4 aA, while the random component due to the amplifier input-offset voltage should remain at ±10 aA for offsets in the ±10-mV range.

Figure 12:
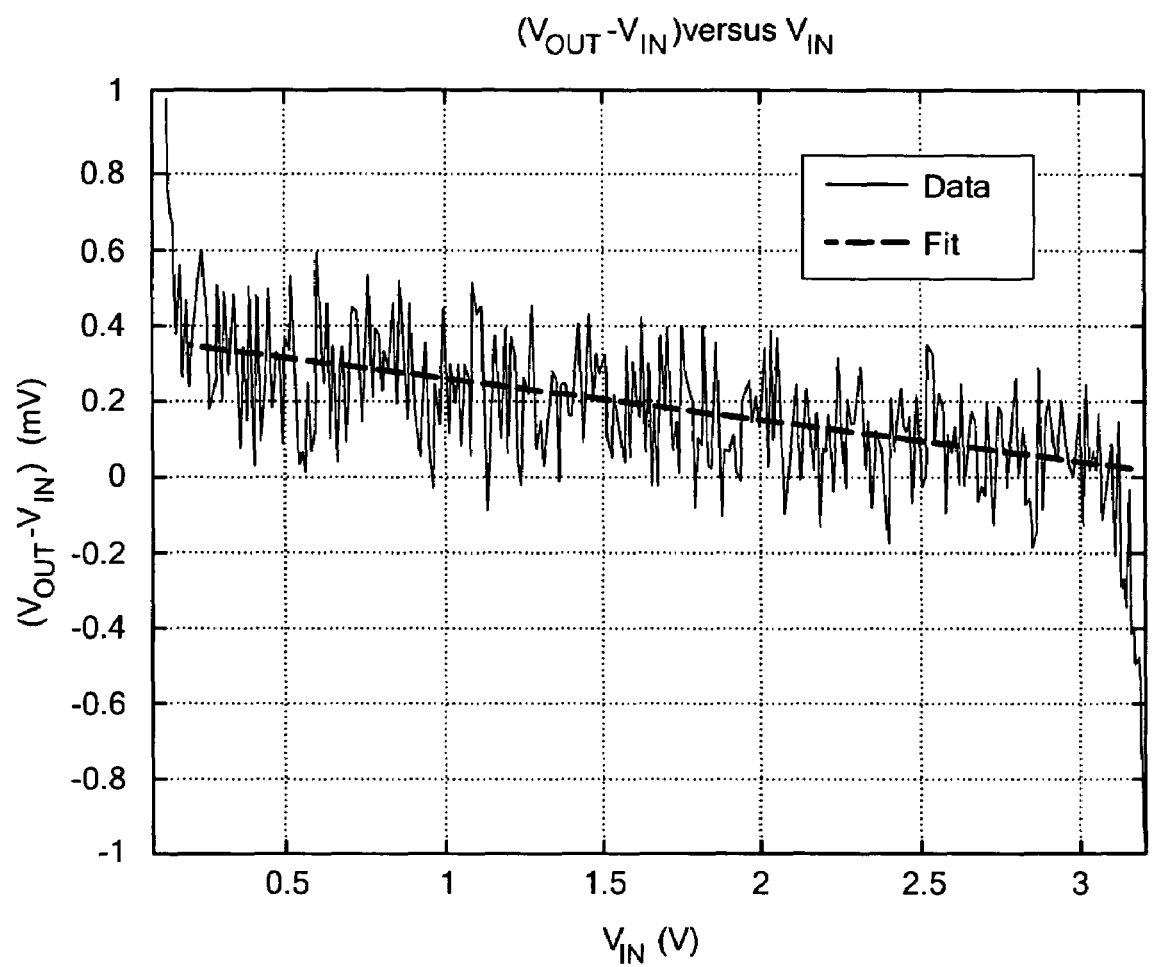
FIG. 12 is a graphical depiction of a difference between input and stored voltage in a single-sided cell.

The measured dc input-output response of a representative single-sided storage cell with $V_{DD}$=3.3V, $V_{REF}$=1.65V, and an amplifier bias current of 1.5-nA is shown in FIG. 12. The plot shows the difference between the input and stored voltage as a function of the input voltage, as well as a first-order fit to the relevant portion of the data. For $V_{in}$ below 0.2V and above 3.1V the error rapidly increases, indicating these sampled voltage levels are outside the saturation region of the amplifier's output leg. However, inside these limits the absolute value of the sampling error is less than 600 μV, including 6σ sampling noise. The sampling error when $V_{in}$=$V_{ref}$=1.65V—roughly 200 μV based on the data fit—represents the constant offset error due to charge injection, since at this input level the finite-gain induced error is zero. The fit also shows that at the extremes of $V_{in}$ the sampling error lies within ±200 μV of the nominal offset of 200 μV, indicating a maximum finite-gain induced error of ΔV=±200 μV. The measured dc sweep parameters of the four storage cells that were fabricated are listed in Table III along with the statistical results. Since the absolute sampling error of all cells is less than 2.9V/$2^{12}$≈700 μV, the cells achieve 12-bit accurate sampling.

TABLE III

MEASURED PERFORMANCE OF FABRICATED SINGLE-SIDED STORAGE CELLS

| | Charge-Injection Error | Finite-Gain Error (ΔV) | Input-Output Range (@ $V_{DD}$ = 3.3 V) | Amplifier Offset | Leakage Current |
|---|---|---|---|---|---|
| Single-Sided | | | | | |
| Cell 1 | +100 μV | +200 μV | >2.9 V | −4.9 mV | 20 aA |
| Cell 2 | +200 μV | +200 μV | >2.9 V | +6.4 mV | 72 aA |
| Cell 3 | +200 μV | +200 μV | >2.9 V | +7.0 mV | 65 aA |
| Cell 4 | +200 μV | +150 μV | >2.9 V | −3.4 mV | 23 aA |
| Average | +175 μV | +188 μV | — | +1.3 mV | 45 aA |
| Std. Dev | 50 μV | 25 μV | — | 6.3 mV | 27 aA |

Figure 13:
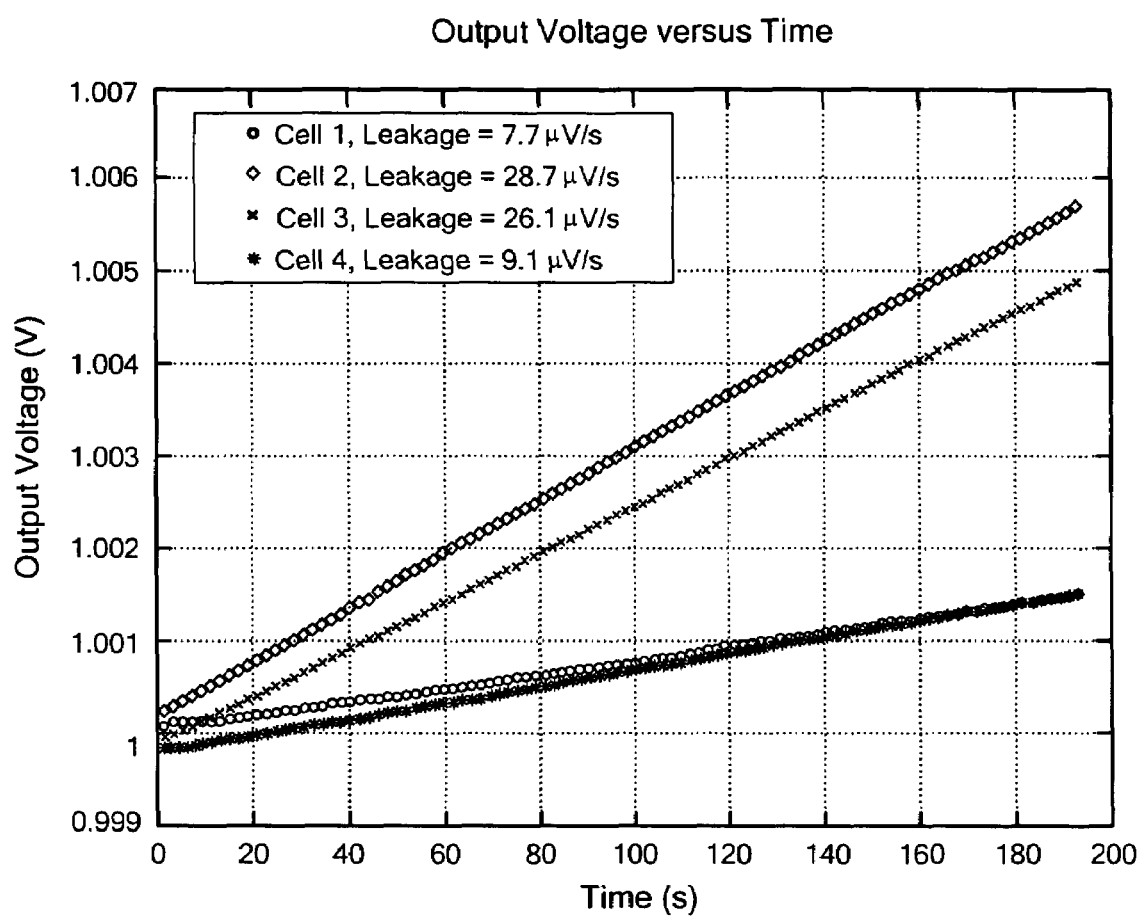
FIG. 13 is a graphical depiction of output voltage versus time for a single-sided cell leakage.

The leakage responses of the four cells are shown in FIG. 13. The leakage was verified to be virtually independent of the sampled voltage level, as expected, so the sampled voltage level was arbitrarily chosen to be 1V. The measured amplifier offsets and inferred leakage currents of each cell are listed in Table III above. The measurements show that the average leakage of the cell is roughly a factor of three larger than the value seen in FIG. 7, and the change in leakage for a given change in offset voltage is between four and five times larger than that seen in FIG. 7, in agreement with the above.

Figure 14:
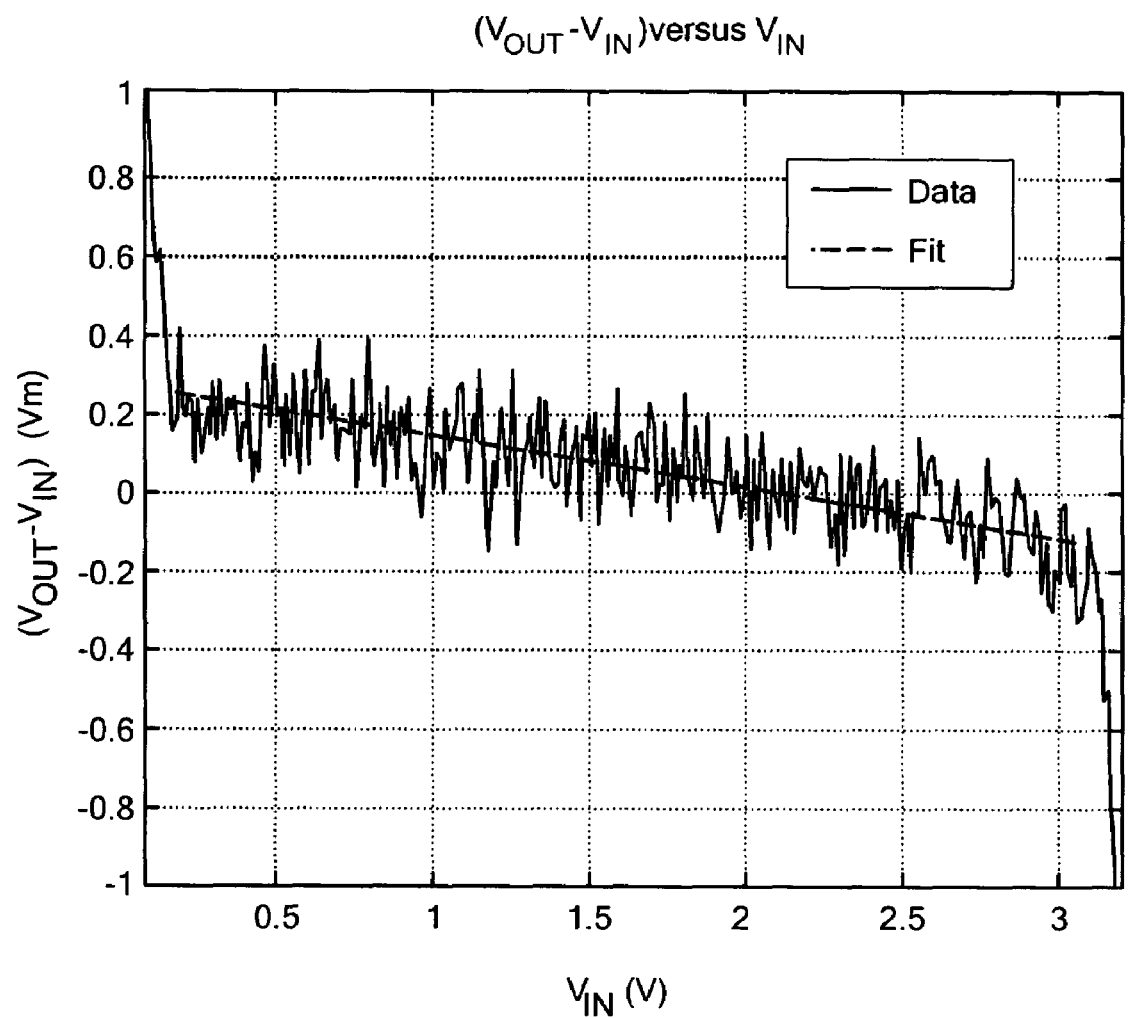
FIG. 14 is a graphical depiction of a difference between input and stored voltage in a differential cell.

The measured dc input-output response of a representative differential storage cell with $V_{DD}$=3.3 V, $V_{ref}$=1.65 V, and an amplifier bias current of 1.5 nA is shown in FIG. 14, along with a first-order fit. This differential cell exhibits an input output range spanning 0.2 to 3.1 V, a charge-injection offset of 75 μV, and a maximum finite-gain error of ΔV=±200 μV. The measured dc sweep parameters of all four differential cells are summarized in Table IV.

TABLE IV

MEASURED PERFORMANCE OF FABRICATED DIFFERENTIAL STORAGE CELLS

| | Charge Injection Error | Finite-Gain Error (ΔV) | Input-Output Range (@ $V_{DD}$ = 3.3 V) | Amplifier Offset | Leakage Current |
|---|---|---|---|---|---|
| Differential | | | | | |
| Cell 1 | +75 μV | ±200 μV | >2.9 V | +12 mV | 15 aA |
| Cell 2 | +50 μV | ±100 μV | >2.9 V | +5.9 mV | 9 aA |
| Cell 3 | +50 μV | ±150 μV | >2.9 V | +6.4 mV | 2 aA |
| Cell 4 | +100 μV | ±125 μV | >2.9 V | +4.2 mV | 9 aA |
| Average | +69 μV | ±144 μV | — | +3.9 mV | 8.8 aA |
| Std. Dev | +24 μV | 43 μV | — | 7.6 mV | 5.3 aA |

Notice that the input-output range and finite-gain error are similar for the differential and single sided cells, as expected, but the charge injection offset is consistently smaller in the differential cells. Since the absolute sampling error is now less than 400 μV, including 6σ sampling noise, and the input-output range remains greater than 2.9 V, these cells achieve 12-bit accurate sampling.

Figure 15:
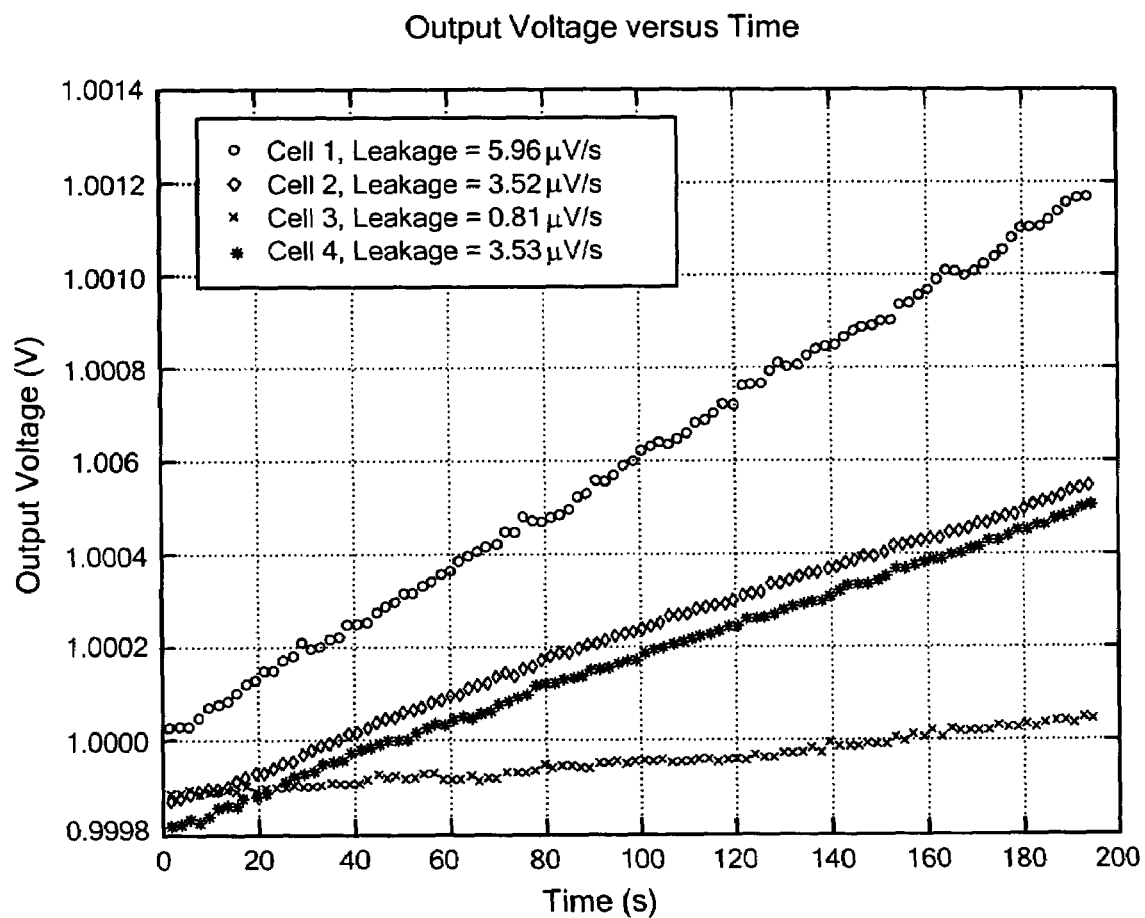
FIG. 15 is a graphical depiction of differential cell leakage.

The leakage responses of the four differential cells are shown in FIG. 15, and a summary of the inferred leakage currents and measured amplifier offsets of each cell are listed in Table IV. It can be seen that the differential cell leakages still vary with amplifier offset, but the standard deviation of this dependence has been significantly reduced by the decreased junction area. The average leakage current of the differential cells is 9 aA per cell, with only one cell exceeding this level of leakage due to its large amplifier offset voltage. This was verified by externally reducing the amplifier offset to +7 mV, which reduced this cell's leakage to under 10 aA.

To compare these results with past cells, the framework introduced above is used. The nominal leakage of the single sided cells should be less than the theoretical leakage given in Table I multiplied by the appropriate scaling factor for drain-to-bulk voltage minimization, or (0.68 fA) (0.2)=136 aA. The measured leakage is less than 80 aA in the worst case, 45 aA in the average case, and is clearly under the estimated bound. These cells' worst-case leakage is already comparable to the leakage of known implementations.

The differential cells implement drain-to-bulk voltage minimization as well as differential leakage cancellation, and their leakage should be bounded by (0.68 fA)(0.2)(0.2)=27 aA. The achieved leakage is less than 15 aA in the worst case, 9 aA in the average case, again under the estimated upper bound. The average leakage is more than eight times lower than the leading known implementation.

Figure 16:
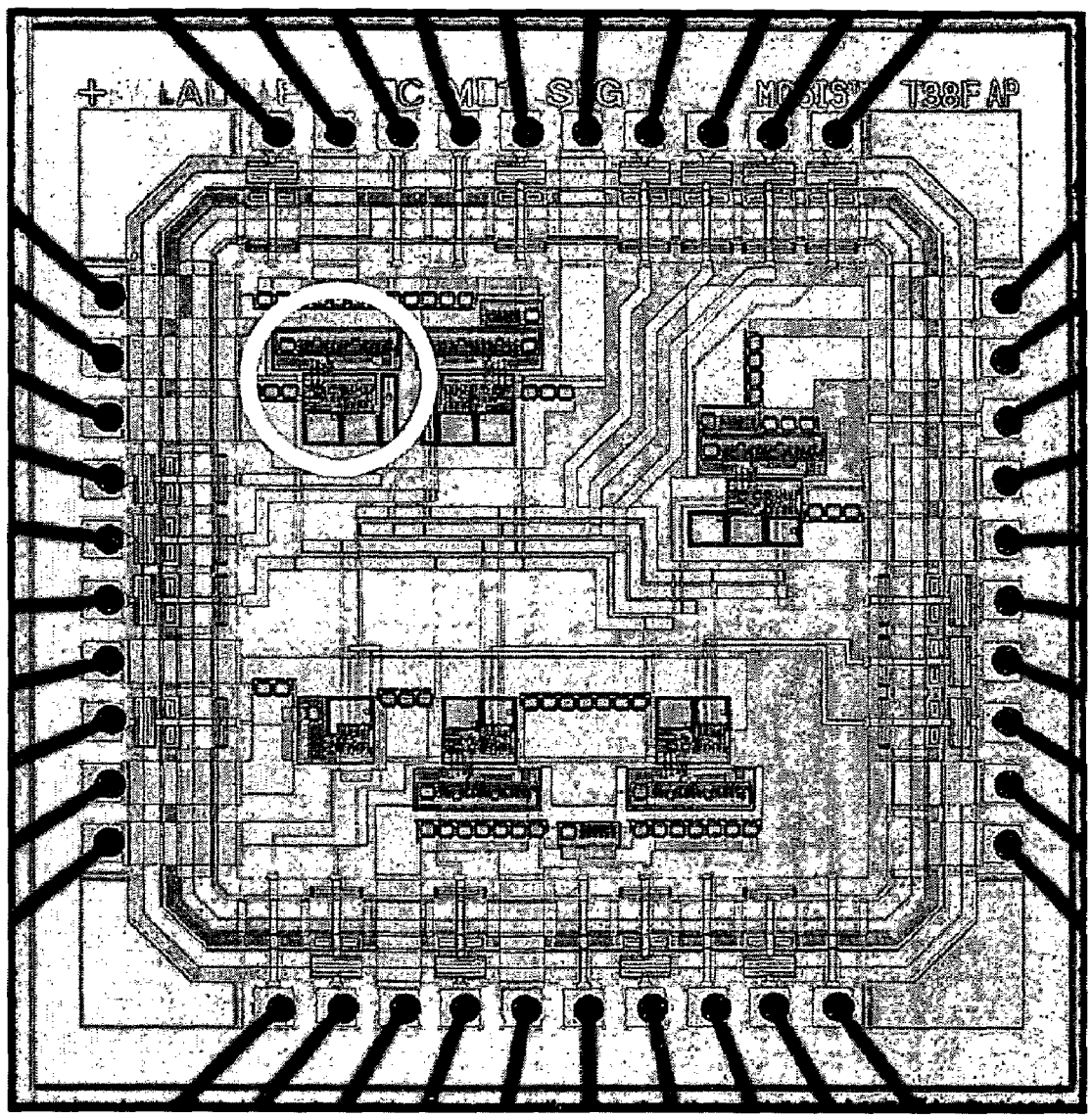
FIG. 16 is a pictorial representation of a die having a differential cell.

A die photo of the differential cell is shown in FIG. 16. Additionally, other cell parameters of interest are included in Table V.

TABLE V

ADDITIONAL CELL PARAMETERS

|  | Single Sided | Differential |
| --- | --- | --- |
| Power Consuption | 10 ms | 10 nW |
| Sampling Period | 10 ms | 10 ms |
| 12-bit/8-bit Hold (Average) | 39 s/630 s | 3/35 min/54 min |
| Digital Control Area | 28,000 $\mu m^2$ | 28,000 $\mu m^2$ |
| Analog Cell Area | 26,500 $\mu m^2$ | 35,000 $\mu m^2$ |

In particular, the differential cells on average lose one bit of voltage accuracy, 700 µV on a 12-bit scale and 11.3 mV on an 8-bit scale, in 3.3 and 54 minutes, respectively. The hold time of this cell at these voltage accuracies is fifteen times longer than known cells, using only 92% as much area. Since junction leakage nominally decreases with the square of the feature size, the design achieves even lower leakage and smaller cell sizes in more modem processes. This is supported by measurements taken from several minimum-sized 0.5-µm versions of the low-leakage switch, which exhibit over an order of magnitude less leakage than the 1.5-µm versions presented here. These results agree with the expected leakage reduction due to feature-size scaling.

With regard to the storage cells' relatively slow 10-ms sampling time, it should be noted that in order to demonstrate that the proposed leakage reduction technique can be used in low-power design, the cells were biased at low current levels, making them slow. However, the usual power versus speed tradeoff can be applied to these cells without affecting their leakage performance. With regard to temperature dependence of cell leakage, measurements revealed that the residual leakage is thermally activated, increasing by roughly a factor of three per 10° C. Since this behavior is similar to that of a standard diode, the data is not shown for brevity. Another issue that should be mentioned is that capacitor soakage—the voltage-dependent polarization of a capacitor's dielectric—fundamentally limits the performance of any sample-and-hold circuit. This effect is typically ignored in analog storage cells because, due to the applications in which they are used, the stored voltages usually remain within a small neighborhood of the full input-output voltage range of the cell. However, for true rail-to-rail sample-and-hold operation, capacitor soakage will limit the sampling accuracy and initial leakage of the cell, and should be considered.

Embodiments of the present invention include using an on-chip current integration technique to characterize the dominant sources of MOS drain leakage, an accumulation-mode leakage mechanism that can dominate junction diode leakage. A novel ultra-low leakage switch topology can be incorporated in a differential storage cell to achieve an average leakage of 10 aA at room temperature, an eight time reduction over past designs. In an exemplary embodiment, the cell loses one bit of voltage accuracy, 700 µV on a 12-bit scale and 11.3 mV on an 8-bit scale, in 3.3 and 54 min, respectively. This represents a fifteen fold increase in hold time at these voltage accuracies over past designs. Since the leakage is independent of amplifier speed, the cell can operate on as little as 10 nW of power.

Having described exemplary embodiments of the invention, it will now become apparent to one of ordinary skill in the art that the techniques of minimizing subthreshold conduction, diode leakage, vertical bipolar conduction, and accumulation-mode diffusion in the inventive switch topologies and storage cells described herein are applicable to other areas, including but not limited to analog filters, switched-capacitor circuits, photoreceptors, imager arrays, and hardware neural networks. It will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

What is claimed is:

1. A differential leakage canceling analog storage cell circuit having a sample phase and a hold phase, comprising:
   a signal receiving terminal;
   a reference voltage source;
   a first switch having a first terminal coupled to the signal receiving terminal and a second terminal;
   a second switch having a first terminal coupled to the second terminal of the first switch and a second terminal;
   a first sampling capacitor having a first end coupled to the second terminal of the first switch and a second end;
   a second sampling capacitor having a first end coupled to a voltage source and a second end;
   a leakage canceling transistor having gate, source, drain and bulk terminals and a residual leakage between the source and bulk terminals and having the drain and bulk terminals connected to the reference voltage source and having the source terminal connected to the second end of the second sampling capacitor;
   an amplifier having first and second input terminals and an output terminal, the first input terminal coupled to the second end of the second sampling capacitor and the source terminal of the leakage canceling transistor, the second input terminal coupled to the second end of the first sampling capacitor, and the output terminal being coupled to the second end of the second switch and the second end of the first sampling capacitor via a switch structure;
   wherein the switch structure includes:
   a core transistor having gate, source, drain and bulk terminals and a residual leakage between the source and bulk terminals and having the bulk terminal connected to the reference voltage source and having the source terminal connected to the second end of the first sampling capacitor and the second input terminal of the amplifier;
   a disconnect switch coupled to the drain of the core transistor and to the amplifier output terminal to selectively disconnect the core transistor drain from the amplifier output terminal during the hold phase; and
   a connect switch coupled to the drain of the core transistor and to the reference voltage source to connect the drain of the core transistor to the reference voltage source during the hold phase,
   wherein the residual leakage of the leakage canceling transistor into the second sampling capacitor substantially cancels the residual leakage of the core transistor into the first sampling capacitor.

2. The circuit according to claim 1, wherein the analog storage cell circuit has less than 10 aA leakage at room temperature.

3. The circuit according to claim 1, further including a compensating capacitor and a reset switching device coupled to an output of the amplifier.

4. A method, comprising:
   providing a signal receiving terminal;
   providing a reference voltage source;

providing a first switch having a first terminal coupled to the signal receiving terminal and a second terminal;

providing a second switch having a first terminal coupled to the second terminal of the first switch and a second terminal;

providing a first sampling capacitor having a first end coupled to the second terminal of the first switch and a second end;

providing a second sampling capacitor having a first end coupled to a voltage source and a second end;

providing a leakage canceling transistor having gate, source, drain and bulk terminals and a residual leakage between the source and bulk terminals and having the drain and bulk terminals connected to the reference voltage source and having the source terminal connected to the second end of the second sampling capacitor;

providing an amplifier having first and second input terminals and an output terminal, the first input terminal coupled to the second end of the second sampling capacitor and the source terminal of the leakage canceling transistor, the second input terminal coupled to the second end of the first sampling capacitor, and the output terminal being coupled to the second end of the second switch and the second end of the first sampling capacitor via a switch structure;

wherein the switch structure includes:
- a core transistor having gate, source, drain and bulk terminals and a residual leakage between the source and bulk terminals and having the bulk terminal connected to the reference voltage source and having the source terminal connected to the second end of the first sampling capacitor and the second input terminal of the amplifier;
- a disconnect switch coupled to the drain of the core transistor and to the amplifier output terminal to selectively disconnect the core transistor drain from the amplifier output terminal during the hold phase; and
- a connect switch coupled to the drain of the core transistor and to the reference voltage source to connect the drain of the core transistor to the reference voltage source during the hold phase, wherein the residual leakage of the leakage canceling transistor into the second sampling capacitor substantially cancels the residual leakage of the core transistor into the first sampling capacitor.

\* \* \* \* \*

UNITED STATES PATENT AND TRADEMARK OFFICE
CERTIFICATE OF CORRECTION

PATENT NO.       : 7,436,221 B2                                         Page 1 of 1
APPLICATION NO.  : 11/256632
DATED            : October 14, 2008
INVENTOR(S)      : Micah Galletta O'Halloran et al.

It is certified that error appears in the above-identified patent and that said Letters Patent is hereby corrected as shown below:

Col. 2, line 38, delete ", maybe" and replace with -- , may be --.

Col. 5, line 60, delete "servos" and replace with -- serves --.

Col. 6, line 41, delete "FIG. 1A - B." and replace with -- FIGS 1A - 1B. --.

Col. 8, line 3, delete "of with" and replace with -- of --.

Col. 9, line 2, delete "require" and replace with -- required --.

Col. 14, line 9-10, delete "input output" and replace with -- input-output --.

Col. 14, line 32, delete "charge injection" and replace with -- charge-injection --.

Col. 14, line 51-52, delete "drain-to bulk" and replace with -- drain-to-bulk --.

Col. 15, line 6, delete "Consuption" and replace with -- Consumption --.

Signed and Sealed this

Twentieth Day of January, 2009

JON W. DUDAS
*Director of the United States Patent and Trademark Office*